(12) United States Patent
Park et al.

(10) Patent No.: US 11,211,438 B2
(45) Date of Patent: Dec. 28, 2021

(54) ELECTROLUMINESCENT DISPLAY APPARATUS

(71) Applicant: LG Display Co., Ltd., Seoul (KR)

(72) Inventors: JiYoung Park, Paju-si (KR); KyungHoon Lee, Paju-si (KR); Daehee Kim, Paju-si (KR); Hyeju Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/696,531

(22) Filed: Nov. 26, 2019

(65) Prior Publication Data

US 2020/0176533 A1 Jun. 4, 2020

(30) Foreign Application Priority Data

Dec. 4, 2018 (KR) .................. 10-2018-0154120

(51) Int. Cl.
*H01L 27/32* (2006.01)
*H01L 51/52* (2006.01)
*H01L 51/50* (2006.01)

(52) U.S. Cl.
CPC ...... *H01L 27/3246* (2013.01); *H01L 27/3211* (2013.01); *H01L 51/5012* (2013.01); *H01L 51/5203* (2013.01)

(58) Field of Classification Search
None
See application file for complete search history.

(56) References Cited

U.S. PATENT DOCUMENTS

2018/0301519 A1* 10/2018 Ma ................. H01L 27/3246

FOREIGN PATENT DOCUMENTS

| KR | 10-2014-0020674 A | 2/2014 |
| KR | 10-2015-0042759 A | 4/2015 |

\* cited by examiner

*Primary Examiner* — Steven B Gauthier
(74) *Attorney, Agent, or Firm* — Polsinelli PC

(57) ABSTRACT

An electroluminescent display apparatus comprises a first subpixel, a second subpixel, and a third subpixel defined on a substrate; a first electrode disposed in each of the first subpixel, the second subpixel, and the third subpixel in the substrate; a bank provided between two adjacent subpixels among the first subpixel, the second subpixel, and the third subpixel to cover an edge of the first electrode; a first light emitting layer disposed on the first electrode of the first subpixel; a second light emitting layer disposed on the first electrode of the second subpixel; a third light emitting layer disposed on the first electrode of the third subpixel; and a second electrode disposed on the first to third light emitting layers, wherein the third light emitting layer is extended onto the bank between the first subpixel and the second subpixel.

20 Claims, 19 Drawing Sheets

ELECTROLUMINESCENT DISPLAY APPARATUS

CROSS REFERENCE TO RELATED APPLICATION

This application claims the benefit of the Korean Patent Application No. 10-2018-0154120 filed on Dec. 4, 2018, which is hereby incorporated by reference in its entirety.

BACKGROUND

Field of the Disclosure

The preset disclosure relates to an electroluminescent display apparatus, and more particularly, to an electroluminescent display apparatus for emitting lights of different colors from subpixels.

Description of the Background

Electroluminescent display apparatuses are apparatuses where a light emitting layer is provided between two electrodes (i.e., an anode electrode and a cathode electrode) and emits light with an electric field generated between the two electrodes, thereby displaying an image.

The light emitting layer may be formed of an organic material or an inorganic material such as a quantum dot. In the light emitting layer, an exciton is generated by a combination of an electron and a hole, and when the exciton is shifted from an excited state to a ground state, light is emitted.

The light emitting layer may emit lights of different colors (for example, red, green, and blue) in subpixels and may emit lights of the same color (for example, white light) in the subpixels.

In a case where the light emitting layer emits light of the same color (for example, white light) in each subpixel, an electric charge moves through the light emitting layer between subpixels adjacent to each other, and due to this, a leakage current occurs, causing the degradation in image quality.

On the other hand, in a case where the light emitting layer emits lights of different colors (for example, red light, green light, and blue light) in subpixels, the leakage current does not occur. In this case, however, there is a limitation in a process of precisely depositing different light emitting layers in the subpixels which are densely arranged.

SUMMARY

Accordingly, the present disclosure is directed to an electroluminescent display apparatus that substantially obviates one or more problems due to limitations and disadvantages of the prior art.

An aspect of the present disclosure provides an electroluminescent display apparatus in which different light emitting layers are provided in subpixels to prevent the occurrence of a leakage current, and thus, different light emitting layers are precisely provided in the subpixels which are densely arranged.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an electroluminescent display apparatus including a substrate including a first subpixel, a second subpixel, and a third subpixel, a first electrode in each of the first subpixel, the second subpixel, and the third subpixel in the substrate, a bank provided between the first subpixel, the second subpixel, and the third subpixel to cover an edge of the first electrode, a first light emitting layer on the first electrode of the first subpixel, a second light emitting layer on the first electrode of the second subpixel, a third light emitting layer on the first electrode of the third subpixel, and a second electrode on the first to third light emitting layers, wherein the third light emitting layer is additionally provided on the bank between the first subpixel and the second subpixel, and the additionally provided third light emitting layer overlaps the first light emitting layer and the second light emitting layer.

In another aspect of the present disclosure, there is provided an electroluminescent display apparatus including a first pixel including a first subpixel emitting light of a first color, a second subpixel emitting light of a second color, and a third subpixel emitting light of a third color, the first pixel being provided in a substrate, a second pixel including the first subpixel, the second subpixel, and the third subpixel in the substrate, the second subpixel being provided in the substrate, a first electrode in each of the first subpixel, the second subpixel, and the third subpixel in the substrate, a bank provided between the first pixel and the second pixel and between the first to third subpixels to cover an edge of the first electrode, a first light emitting layer on the first electrode of the first subpixel, a second light emitting layer on the first electrode of the second subpixel, a third light emitting layer on the first electrode of the third subpixel, and a second electrode on the first to third light emitting layers, wherein the third light emitting layer is additionally provided on the bank between the first subpixel and the second subpixel, and the additionally provided third light emitting layer overlaps the first light emitting layer and the second light emitting layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
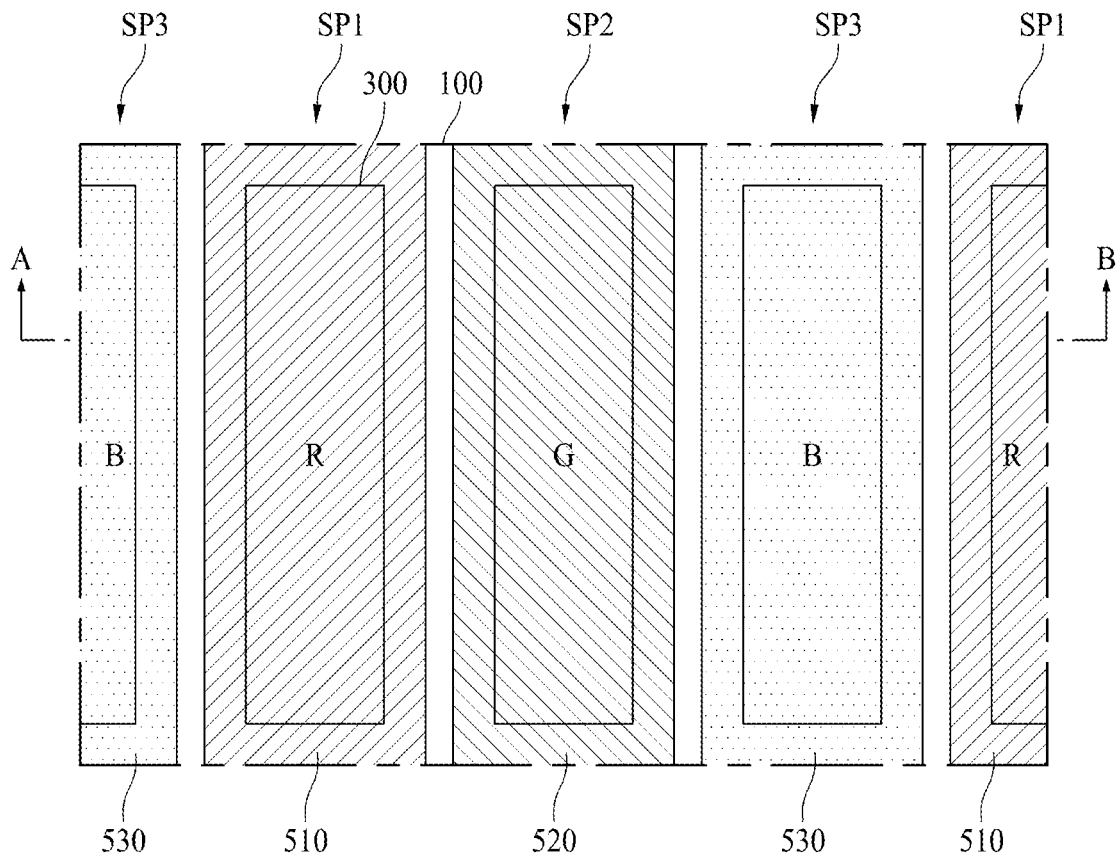
FIG. 1 is a schematic plan view of an electroluminescent display apparatus according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, exemplary aspects of the present disclosure will be described in detail with reference to the accompanying drawings.

FIG. 1 is a schematic plan view of an electroluminescent display apparatus according to an aspect of the present disclosure.

As seen in FIG. 1, the electroluminescent display apparatus according to an aspect of the present disclosure may include a substrate 100, a first electrode 300, and a plurality of light emitting layers 510 to 530.

A plurality of subpixels SP1 to SP3 may be provided in the substrate 100.

The plurality of subpixels SP1 to SP3 may include a first subpixel SP1, a second subpixel SP2, and a third subpixel SP3.

The first subpixel SP1, the second subpixel SP2, and the third subpixel SP3 may be sequentially arranged in a widthwise direction, and thus, the first subpixel SP1 may be disposed adjacent to the second subpixel SP2 and the third subpixel SP3, the second subpixel SP2 may be disposed adjacent to the third subpixel SP3 and the first subpixel SP1, and the third subpixel SP3 may be disposed adjacent to the first subpixel SP1 and the second subpixel SP2.

The first subpixel SP1 may be provided to emit light (for example, red (R) light) having a first color, the second subpixel SP2 may be provided to emit light (for example, green (G) light) having a second color, and the third subpixel SP3 may be provided to emit light (for example, blue (B) light) having a third color. However, the present disclosure is not limited thereto, and a color of light emitted from each of the first to third subpixels SP1 to SP3 may be variously changed.

The first electrode 300 may be patterned in each of the plurality of subpixels SP1 to SP3. That is, one first electrode 300 may be provided in the first subpixel SP1, another first electrode 300 may be provided in the second subpixel SP2, and the other first electrode 300 may be provided in the third subpixel SP3. The first electrode 300 may function as an anode of the electroluminescent display apparatus.

The light emitting layers 510 to 530 may include a first light emitting layer 510 provided in the first subpixel SP1, a second light emitting layer 520 provided in the second subpixel SP2, and a third light emitting layer 530 provided in the third subpixel SP3.

The first light emitting layer 510 may include an organic light emitting layer which emits light (for example, red light) of the first color, the second light emitting layer 520 may include an organic light emitting layer which emits light (for example, green light) of the second color, and the third light emitting layer 530 may include an organic light emitting layer which emits light (for example, blue light) of the third color. The first light emitting layer 510, the second light emitting layer 520, and the third light emitting layer 530 may be spaced apart from one another by a certain interval, but is not limited thereto.

Figure 2:
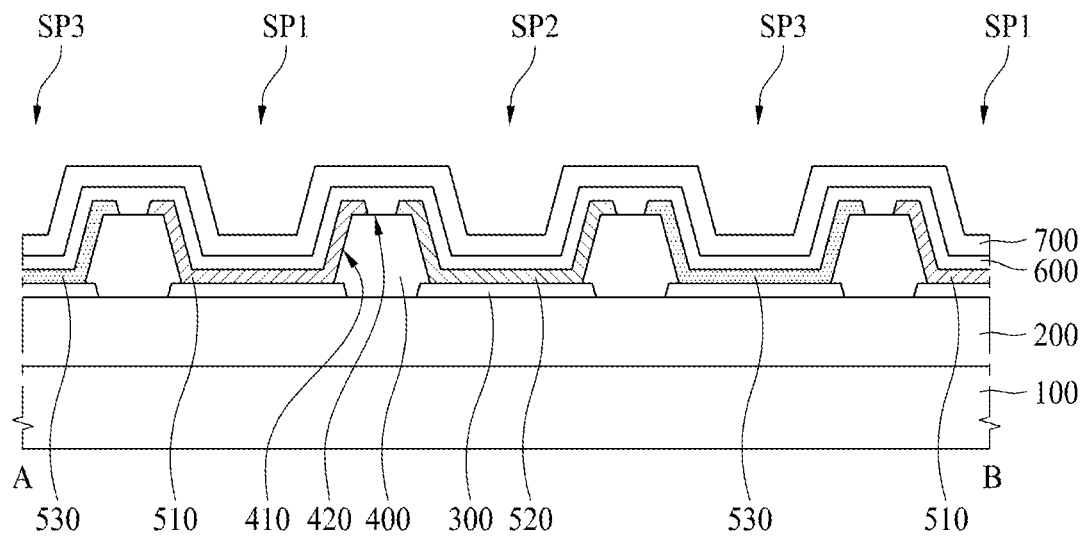
FIG. 2 is a cross-sectional view of an electroluminescent display apparatus according to an aspect of the present disclosure and is a cross-sectional view according to an aspect taken along line A-B of FIG. 1.

FIG. 2 is a cross-sectional view of an electroluminescent display apparatus according to an aspect of the present disclosure and is a cross-sectional view according to an aspect taken along line A-B of FIG. 1.

As seen in FIG. 2, the electroluminescent display apparatus according to an aspect of the present disclosure may include a substrate 100, a circuit device layer 200, a first electrode 300, a bank 400, a plurality of light emitting layers 510 to 530, a second electrode 600 and an encapsulation layer 700.

The substrate 100 may be formed of glass or plastic, but is not limited thereto and may be formed of a semiconductor material such as a silicon wafer. The substrate 100 may be formed of a transparent material or an opaque material. The electroluminescent display apparatus according to an aspect of the present disclosure may be implemented as a top emission type where emitted light is discharged to an upper portion, or a bottom emission type where emitted light is discharged to a lower portion. Accordingly, a material of the substrate 100 may use an opaque material as well as a transparent material.

The circuit device layer 200 may be provided on the substrate 100.

A circuit device including various signal lines, a thin film transistor (TFT), a capacitor, and the like may be provided in the circuit device layer 200 in each of subpixels SP1 to SP3.

The signal lines may include a gate line, a data line, a power line, and a reference line, and the TFT may include a switching TFT, a driving TFT, and a sensing TFT.

The switching TFT may be turned on according to a gate signal supplied through the gate line and may transfer a data voltage, supplied through the data line, to the driving TFT.

The driving TFT may be turned on with the data voltage supplied through the switching TFT and may generate a data current from power supplied through the power line to supply the data current to the first electrode 300.

The sensing TFT may sense a threshold voltage deviation of the driving TFT which causes the degradation in image quality and may supply a current of the driving TFT to the reference line in response to a sensing control signal supplied through the gate line or a separate sensing line.

The capacitor may hold the data voltage supplied to the driving TFT during one frame and may be connected to a gate terminal and a source terminal of the driving TFT.

Each of the switch TFT, the driving TFT, and the sensing TFT may be changed to have various structures such as a top gate structure and a bottom gate structure known to those skilled in the art. Also, the circuit device layer 200 may further include a passivation layer for protecting the switch TFT, the driving TFT, and the sensing TFT and a planarization layer provided on the passivation layer.

The first electrode 300 may be patterned on the circuit device layer 200 in each of the subpixels SP1 to SP3. The first electrode 300 may be connected to the driving TFT provided in the circuit device layer 200. In detail, the first electrode 300 may be connected to a source electrode or a drain electrode of the driving TFT through a contact hole which is provided in the passivation layer and the planarization layer.

The bank 400 may be provided in a boundary region between the plurality of subpixels SP1 to SP3 to cover an edge of the first electrode 300. The bank 400 may be provided in the boundary region between the plurality of subpixels SP1 to SP3 adjacent to one another, and thus, may be wholly provided in a matrix structure. An emission area may be defined in the plurality of subpixels SP1 to SP3 by the bank 400. That is, an exposure region, which is exposed without being covered by the bank 400, of the first electrode 300 may configure the emission area.

The light emitting layers (for example, first to third light emitting layers) 510 to 530 may be respectively patterned on the first electrode 300 in the subpixels (for example, first to third subpixels) SP1 to SP3. That is, the first light emitting layer 510 may be patterned on the first electrode 300 of the first subpixel SP1, the second light emitting layer 520 may be patterned on the first electrode 300 of the second subpixel SP2, and the third light emitting layer 530 may be patterned on the first electrode 300 of the third subpixel SP3.

The first light emitting layer 510 may be provided to have a structure where a hole injecting layer, a hole transporting layer, a red light emitting layer, an electron transporting layer, and an electron injecting layer are sequentially stacked. The second light emitting layer 520 may be provided to have a structure where a hole injecting layer, a hole transporting layer, a green light emitting layer, an electron transporting layer, and an electron injecting layer are sequentially stacked. The third light emitting layer 530 may be provided to have a structure where a hole injecting layer, a hole transporting layer, a blue light emitting layer, an electron transporting layer, and an electron injecting layer are sequentially stacked.

The light emitting layers 510 to 530 may be provided on the bank 400 which is provided in a boundary between the adjacent subpixels SP1 to SP3. For example, the light emitting layers 510 to 530 may extend to a portion of an upper surface 420 of the bank 400 along a side surface 410 of the bank 400. In this case, the light emitting layers 510 to 530 may be disposed apart from one another by a certain interval on the upper surface 420 of the bank 400.

The second electrode 600 may be provided in the light emitting layers 510 to 530. The second electrode 600 may function as a cathode of the electroluminescent display apparatus. The second electrode 600 may be provided in each of the subpixels SP1 to SP3 and the boundary region therebetween. In a case where the electroluminescent display apparatus according to an aspect of the present disclosure is implemented as the top emission type, the second electrode 600 may include a transparent conductive material for transmitting light, emitted from each of the light emitting layers 510 to 530, toward an upper portion. Also, the second electrode 600 may be a semitransparent electrode, and thus, a micro-cavity effect may be obtained for each of the subpixels SP1 to SP3. That is, reflection and re-reflection of light may be repeated between the second electrode 600 including a semitransparent electrode and the first electrode 300 including a reflective electrode, and thus, the micro-cavity effect may be obtained, thereby enhancing light efficiency.

The encapsulation layer 700 may be provided on the second electrode 600 and may prevent external water or oxygen from penetrating into the light emitting layers 510 to 530. The encapsulation layer 700 may be formed of an inorganic insulating material or may be formed in a structure where an inorganic insulating material and an organic insulating material are alternately stacked, but is not limited thereto.

Moreover, a capping layer known to those skilled in the art may be further provided between the second electrode 600 and the encapsulation layer 700, thereby enhancing a light extraction effect.

FIGS. 3A to 3H are manufacturing process views of an electroluminescent display apparatus according to an aspect of the present disclosure and relates a process of manufacturing the above-described electroluminescent display apparatus of FIG. 2.

Figure 3A:
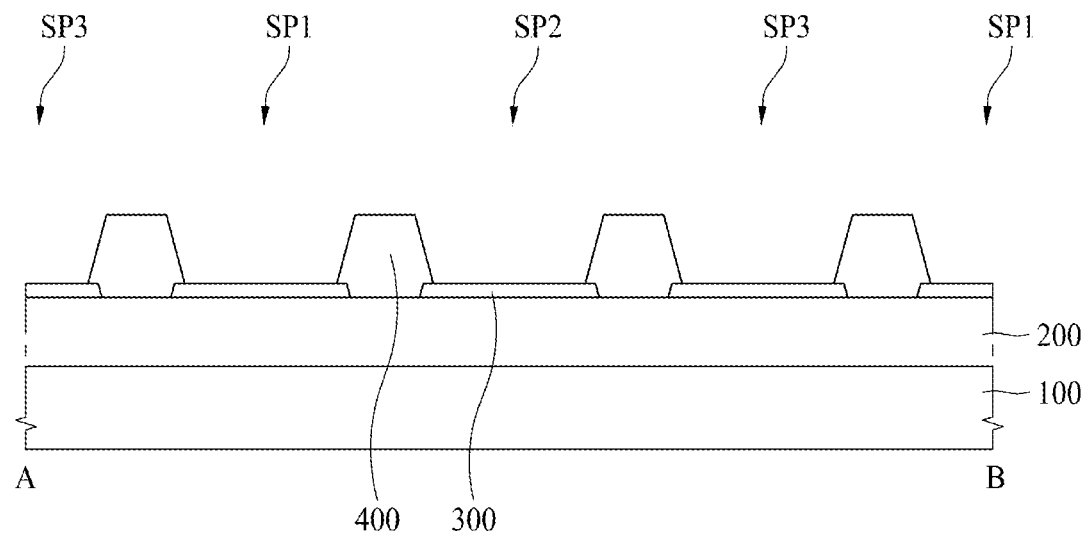
FIGS. 3A to 3H are manufacturing process views of an electroluminescent display apparatus according to an aspect of the present disclosure.

First, as seen in FIG. 3A, a circuit device layer 200 may be formed on a substrate 100, a first electrode 300 may be formed on the circuit device layer 200 in each of subpixels (for example, first to third subpixels) SP1 to SP3, and a bank 400 may be formed to cover an edge of the first electrode 300.

Figure 3B:
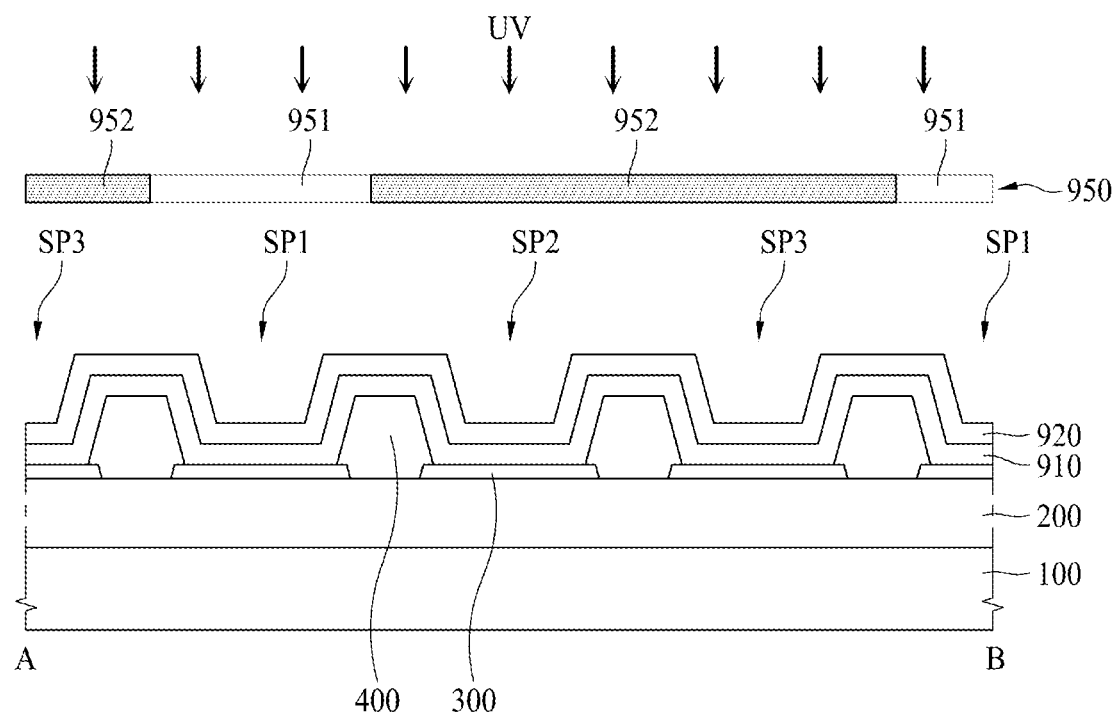

Subsequently, as seen in FIG. 3B, a shield layer 910 and a photoresist layer 920 may be sequentially formed on the first electrode 300 and the bank 400, and then, light may be irradiated onto the photoresist layer 920 in a state where the second subpixel SP2 area and the third subpixel SP3 area are covered by a mask 950.

The mask 950 may include an open portion 951 which transmits light and a light blocking portion 952 which blocks the light. In this case, the open portion 951 may correspond to the first subpixels SP1 area, and the light blocking portion 952 may correspond to the second subpixel SP2 area and the third subpixel SP3 area. Therefore, the light may pass through only the open portion 951 and may be irradiated onto the first subpixel SP1 area without being irradiated onto the second subpixel SP2 area and the third subpixel SP3 area. The light may use ultraviolet (UV).

The shield layer 910 may act as a protection layer which prevents an organic material from being damaged by a solvent which is used in a process of FIG. 3C and a process of FIG. 3E each described below. The shield layer 901 may include a fluorine polymer, but is not limited thereto.

Figure 3C:
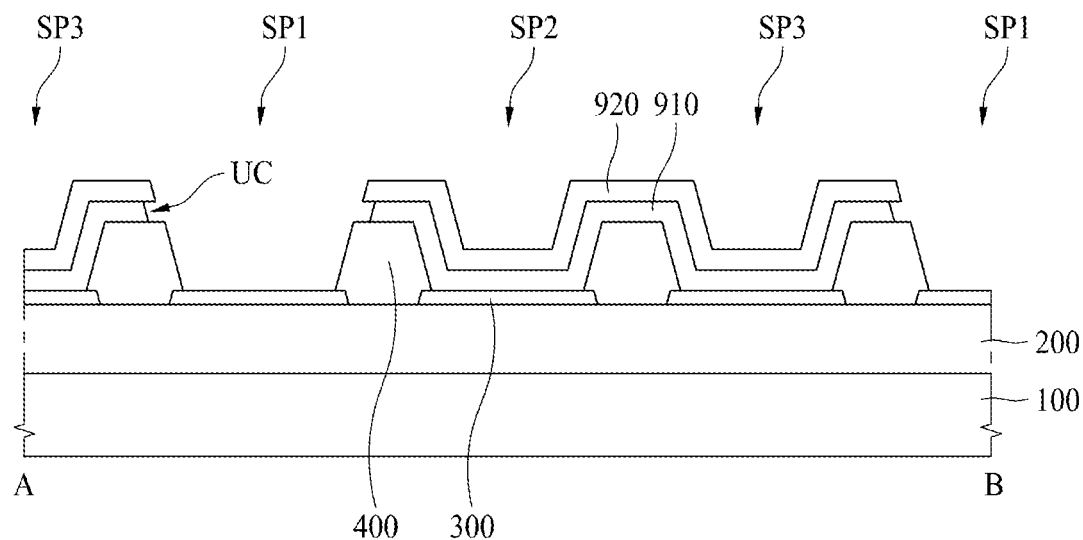

Subsequently, as seen in FIG. 3C, a development process may be performed on the shield layer 910 and the photoresist layer 920 by using a solvent. Therefore, the shield layer 910 and the photoresist layer 920 each provided in the first subpixel SP1 area where light was irradiated may be removed, and the shield layer 910 and the photoresist layer 920 which are provided in each of the second subpixel SP2 area and the third subpixel SP3 area where light was not irradiated may remain. Accordingly, an upper surface of the first electrode 300 of the first subpixel SP1 and an upper surface of a portion of the bank 400 adjacent to the first subpixel SP1 may be exposed.

At this time, the shield layer 910 may be more removed than the photoresist layer 920, and thus, an undercut (UC) structure may be formed under the photoresist layer 920. The undercut structure may enable a solvent to be more smoothly applied when performing a liftoff process of FIG. 3E described below.

Figure 3D:
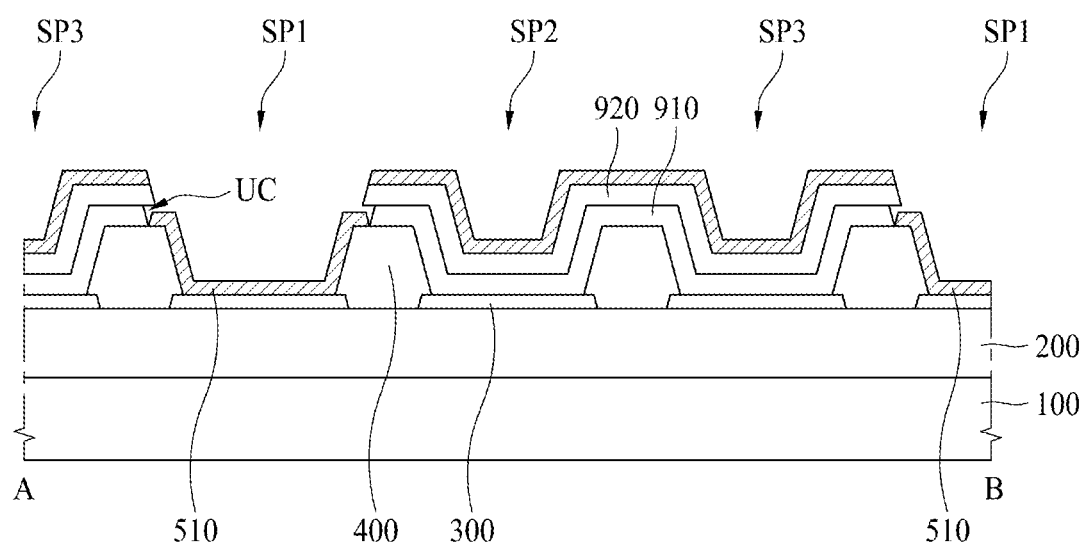

Subsequently, as seen in FIG. 3D, a first light emitting layer 510 may be deposited on the upper surface of the first electrode 300 of the first subpixel SP1, the upper surface of the portion of the bank 400 adjacent to the first subpixel SP1, and an upper surface of the remaining photoresist layer 920.

Figure 3E:
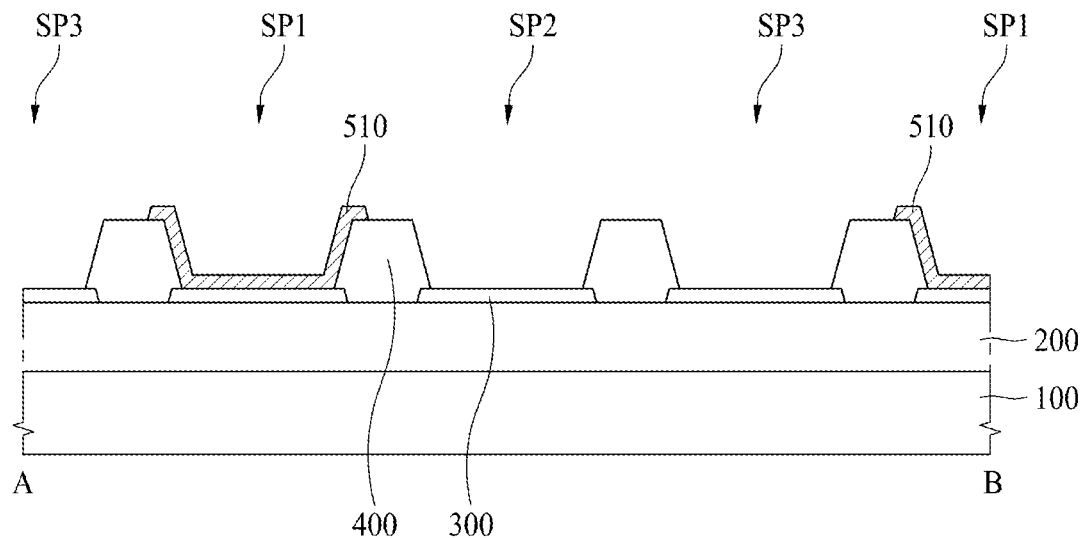

Subsequently, as seen in FIG. 3E, the shield layer 910, the photoresist layer 920, and the first light emitting layer 510 each deposited in the second subpixel SP2 area and the third subpixel SP3 area may be removed through a liftoff process by using a solvent. Therefore, the first light emitting layer 510 may be formed on only the upper surface of the first electrode 300 of the first subpixel SP1 and the upper surface of the portion of the bank 400 adjacent to the first subpixel SP1.

Subsequently, the above-described processes of FIGS. 3B to 3E may be repeated, and as in FIG. 3B, light may be irradiated by using a mask 950 which includes an open portion 951 corresponding to the second subpixel SP2 area and a light blocking portion 952 corresponding to the first subpixel SP1 area and the third subpixel SP3 area.

Figure 3F:
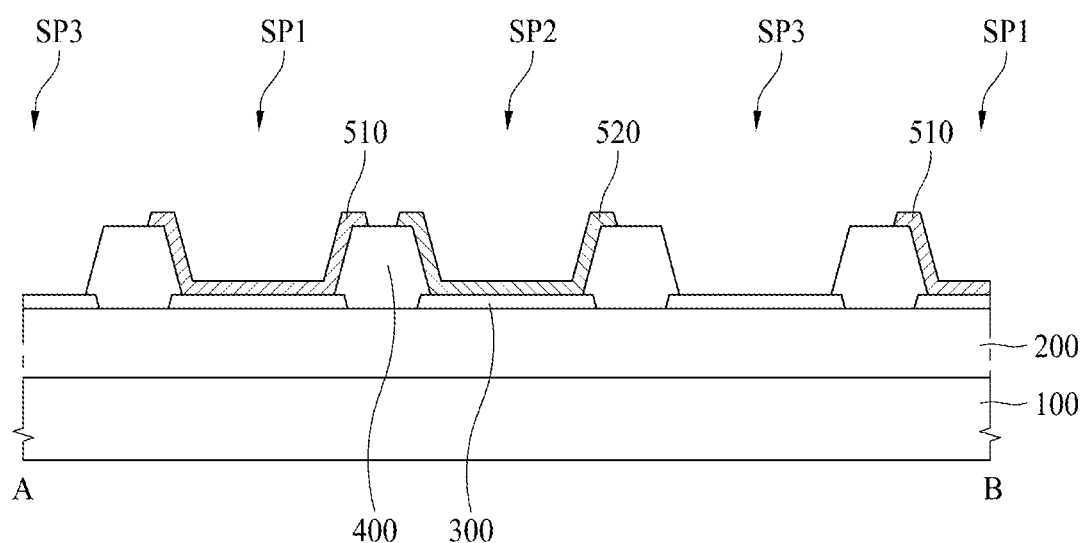

Therefore, as in FIG. 3F, a second light emitting layer 520 may be formed on only an upper surface of the first electrode 300 of the second subpixel SP2 and an upper surface of a portion of the bank 400 adjacent to the second subpixel SP2.

Subsequently, the above-described processes of FIGS. 3B to 3E may be repeated, and as in FIG. 3B, light may be irradiated by using a mask 950 which includes an open portion 951 corresponding to the third subpixel SP3 area and a light blocking portion 952 corresponding to the first subpixel SP1 area and the second subpixel SP2 area.

Figure 3G:
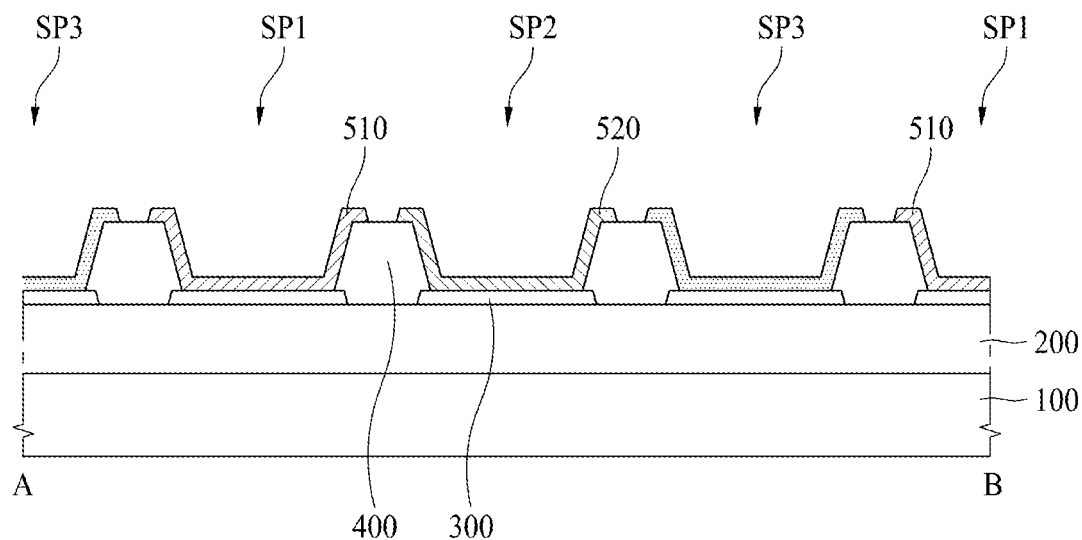

Therefore, as in FIG. 3G, a third light emitting layer 530 may be formed on only an upper surface of the first electrode 300 of the third subpixel SP3 and an upper surface of a portion of the bank 400 adjacent to the third subpixel SP3.

Figure 3H:
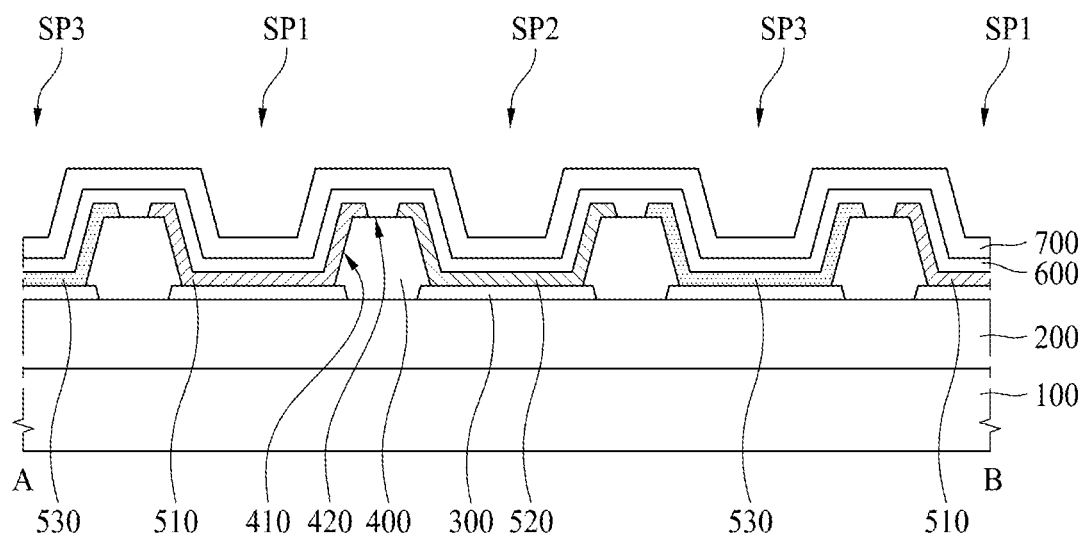

Subsequently, as seen in FIG. 3H, a second electrode 600 may be formed on the light emitting layers 510 to 530 and the bank 400, and an encapsulation layer 700 may be formed on the second electrode 600.

As described above, according to an aspect of the present disclosure, the light emitting layers 510 to 530 emitting different lights may be respectively patterned in the subpixels SP1 to SP3 by using the shield layer 910 and the photoresist layer 920, and thus, the light emitting layers 510 to 530 may be precisely patterned in the subpixels SP1 to SP3 which are densely arranged.

However, in the process of manufacturing the electroluminescent display apparatus according to an aspect of the present disclosure illustrated in each of FIGS. 3A to 3H, a case where the above-described liftoff process of FIG. 3E is not smoothly performed may occur.

To provide a detailed description, the above-described process of FIG. 3E may be a process where the shield layer 910 deposited in the second subpixel SP2 area and the third subpixel SP3 area is detached from the substrate 100 by applying a solvent, and thus, the photoresist layer 920 and the first light emitting layer 510 each disposed on the shield layer 910 are removed together. In this case, a solvent penetration space which enables the solvent to penetrate into a lower surface of the shield layer 910 is limited to the first subpixel SP1 area, and due to this, the solvent may not sufficiently penetrate into the whole second subpixel SP2 area and the whole third subpixel SP3 area. When the solvent does not sufficiently penetrate into the whole second subpixel SP2 area and the whole third subpixel SP3 area, a portion of each of the shield layer 910, the photoresist layer 920, and the first light emitting layer 510 each deposited in the second subpixel SP2 area and the third subpixel SP3 area may remain without being removed. Also, by increasing a time for which the solvent is applied, the shield layer 910, the photoresist layer 920, and the first light emitting layer 510 each deposited in the second subpixel SP2 area and the third subpixel SP3 area may be prevented from remaining.

In this case, however, a process time may increase, and the solvent may contact the layers for a long time, causing the damage of an organic material.

Hereinafter, various aspects of the present disclosure where a time for which a solvent is applied does not increase and the shield layer 910, the photoresist layer 920, and the first light emitting layer 510 do not remain in a liftoff process will be described.

Figure 4:
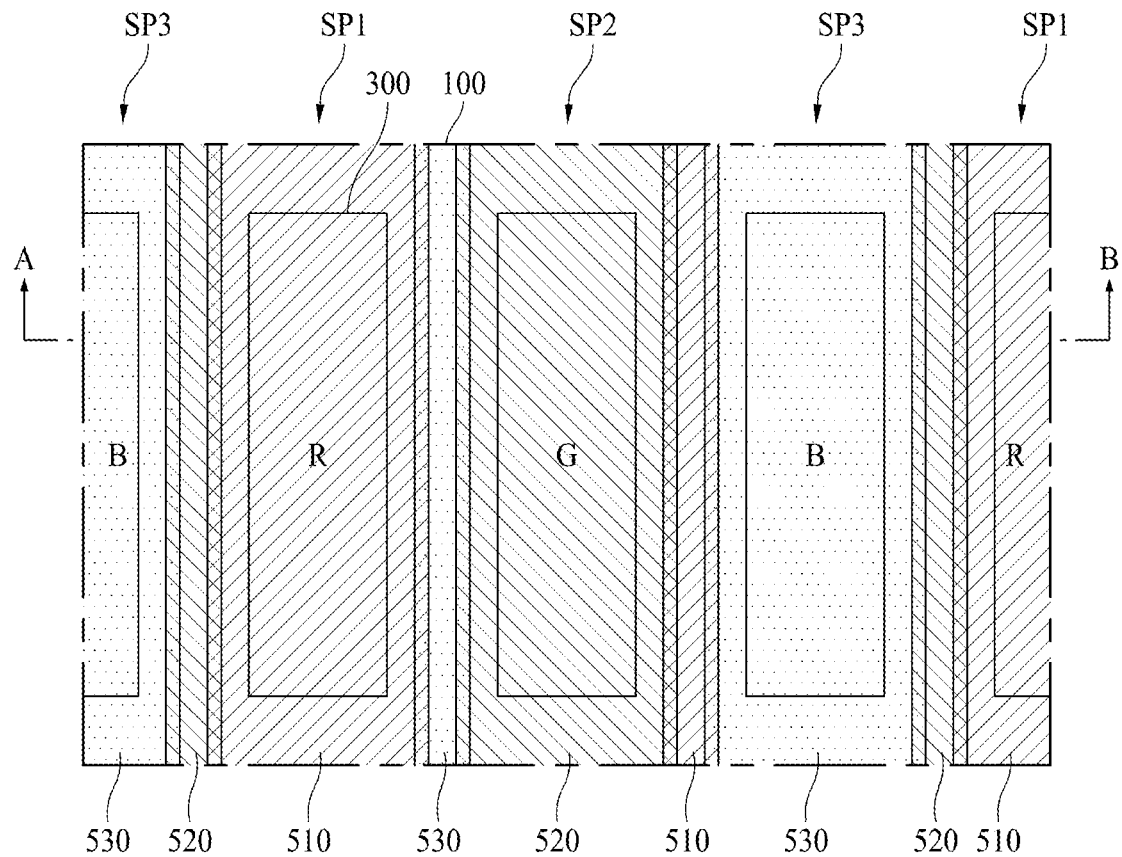
FIG. 4 is a schematic plan view of an electroluminescent display apparatus according to another aspect of the present disclosure.

FIG. 4 is a schematic plan view of an electroluminescent display apparatus according to another aspect of the present disclosure.

As seen in FIG. 4, the electroluminescent display apparatus according to another aspect of the present disclosure may include a substrate 100, a first electrode 300, and a plurality of light emitting layers 510 to 530.

A plurality of subpixels (for example, first to third subpixels) SP1 to SP3 may be provided in the substrate 100. The first electrode 300 may be patterned in each of the plurality of subpixels SP1 to SP3. The plurality of subpixels SP1 to SP3 and the first electrode 300 are the same as those of FIG. 1, and thus, their repetitive descriptions are omitted.

The light emitting layers 510 to 530 may include a first light emitting layer 510 which is provided in the first subpixel SP1 to emit light of a first color, a second light emitting layer 520 which is provided in the second subpixel SP2 to emit light of a second color, and a third light emitting layer 530 which is provided in the third subpixel SP3 to emit light of a third color.

The first light emitting layer 510 and the second light emitting layer 520 may be disposed apart from each other between the first subpixel SP1 and the second subpixel SP2. Also, the second light emitting layer 520 and the third light emitting layer 530 may be disposed apart from each other between the second subpixel SP2 and the third subpixel SP3. Also, the third light emitting layer 530 and the first light emitting layer 510 may be disposed apart from each other between the third subpixel SP3 and the first subpixel SP1.

The first light emitting layer 510 may be further provided between the second subpixel SP2 and the third subpixel SP3. In this case, the first light emitting layer 510 may overlap the second and third light emitting layers 520 and 530 between the second subpixel SP2 and the third subpixel SP3.

The second light emitting layer 520 may be further provided between the third subpixel SP3 and the first subpixel SP1. In this case, the second light emitting layer 520 may overlap the first and third light emitting layers 510 and 530 between the third subpixel SP3 and the first subpixel SP1.

The third light emitting layer 530 may be further provided between the first subpixel SP1 and the second subpixel SP2. In this case, the third light emitting layer 530 may overlap the first and second light emitting layers 510 and 520 between the first subpixel SP1 and the second subpixel SP2.

According to another aspect of the present disclosure, the first light emitting layer 510 may be further provided between the second subpixel SP2 and the third subpixel SP3, the second light emitting layer 520 may be further provided between the third subpixel SP3 and the first subpixel SP1, and the third light emitting layer 530 may be further provided between the first subpixel SP1 and the second subpixel SP2. Accordingly, a solvent penetration space may increase in a liftoff process of manufacturing the electroluminescent display apparatus, and thus, a time for which a solvent is applied may decrease and the shield layer 910, the photoresist layer 920, and the light emitting layers 510 to 530 may be removed without remaining through the liftoff process.

This may be more easily understood with reference to processes of FIGS. 6A to 6H described below.

Figure 5:
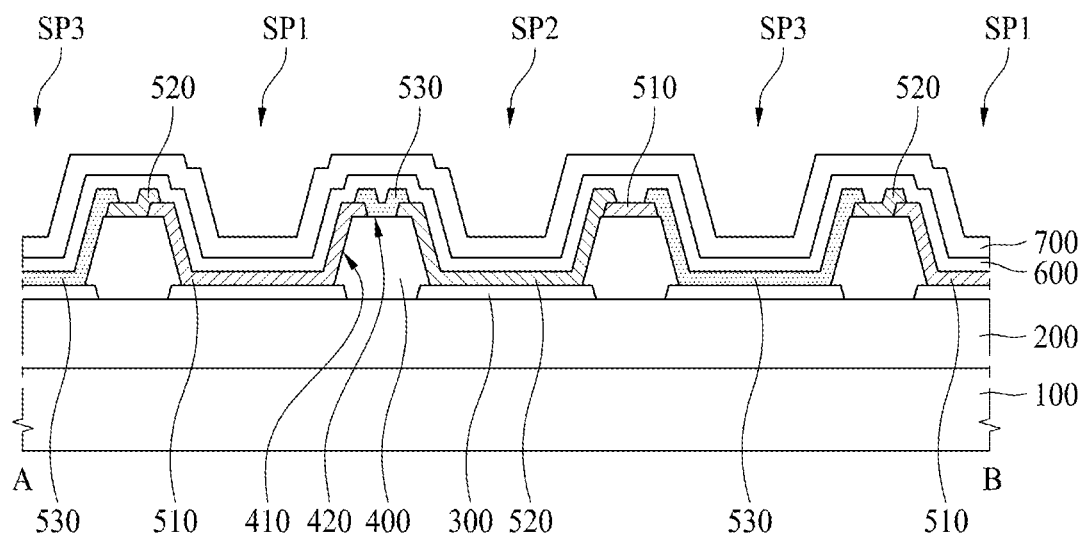
FIG. 5 is a cross-sectional view of an electroluminescent display apparatus according to another aspect of the present disclosure and is a cross-sectional view according to an aspect taken along line A-B of FIG. 4.

FIG. 5 is a cross-sectional view of an electroluminescent display apparatus according to another aspect of the present disclosure and is a cross-sectional view according to an aspect taken along line A-B of FIG. 4.

As seen in FIG. 5, the electroluminescent display apparatus according to another aspect of the present disclosure may include a substrate 100, a circuit device layer 200, a first electrode 300, a bank 400, a plurality of light emitting layers 510 to 530, a second electrode 600, and an encapsulation layer 700.

The substrate 100, the circuit device layer 200, the first electrode 300, the bank 400, the second electrode 600, and the encapsulation layer 700 are the same as those of FIG. 2, and thus, their repetitive descriptions are omitted.

The light emitting layers 510 to 530 may include a first light emitting layer 510 provided on the first electrode 300 of the first subpixel SP1, a second light emitting layer 520 provided on the first electrode 300 of the second subpixel SP2, and a third light emitting layer 530 provided on the first electrode 300 of the third subpixel SP3.

The first light emitting layer 510 may be provided to have a structure where a hole injecting layer, a hole transporting layer, a red organic light emitting layer, an electron transporting layer, and an electron injecting layer are sequentially stacked. The second light emitting layer 520 may be provided to have a structure where a hole injecting layer, a hole transporting layer, a green organic light emitting layer, an electron transporting layer, and an electron injecting layer are sequentially stacked. The third light emitting layer 530 may be provided to have a structure where a hole injecting layer, a hole transporting layer, a blue organic light emitting layer, an electron transporting layer, and an electron injecting layer are sequentially stacked. The light emitting layers 510 to 530 may further include an electron blocking layer provided between the hole transporting layer and the red/green/blue organic light emitting layer and a hole blocking layer provided between the electron transporting layer and the red/green/blue organic light emitting layer.

The first light emitting layer 510 provided on the first electrode 300 of the first subpixel SP1 may extend to a portion of an upper surface 420 along a side surface 410 of the bank 400 provided between the first subpixel SP1 and the second subpixel SP2, and moreover, may extend to a portion of an upper surface 420 along a side surface 410 of the bank 400 provided between the third subpixel SP3 and the first subpixel SP1.

The second light emitting layer 520 provided on the first electrode 300 of the second subpixel SP2 may extend to a portion of an upper surface 420 along a side surface 410 of the bank 400 provided between the second subpixel SP2 and the third subpixel SP3, and moreover, may extend to a portion of an upper surface 420 along a side surface 410 of the bank 400 provided between the first subpixel SP1 and the second subpixel SP2.

The third light emitting layer 530 provided on the first electrode 300 of the third subpixel SP3 may extend to a portion of an upper surface 420 along a side surface 410 of the bank 400 provided between the third subpixel SP3 and the first subpixel SP1, and moreover, may extend to a portion of an upper surface 420 along a side surface 410 of the bank 400 provided between the second subpixel SP2 and the third subpixel SP3.

The first light emitting layer 510 and the second light emitting layer 520 may be disposed apart from each other on the bank 400 between the first subpixel SP1 and the second subpixel SP2, the second light emitting layer 520 and the third light emitting layer 530 may be disposed apart from each other on the bank 400 between the second subpixel SP2 and the third subpixel SP3, and the third light emitting layer 530 and the first light emitting layer 510 may be disposed apart from each other on the bank 400 between the third subpixel SP3 and the first subpixel SP1.

The first light emitting layer 510 may be further provided on the bank 400 between the second subpixel SP2 and the third subpixel SP3. In this case, the first light emitting layer 510 may be provided under the second light emitting layer 520 and the third light emitting layer 530, between the second subpixel SP2 and the third subpixel SP3. Therefore, a whole lower surface of the first light emitting layer 510 may contact the upper surface 420 of the bank 400 and an upper surface of the first light emitting layer 510 may contact a lower surface of the second light emitting layer 520 and a lower surface of the third light emitting layer 530, between the second subpixel SP2 and the third subpixel SP3.

The first light emitting layer 510 provided on the first electrode 300 of the first subpixel SP1 and the first light emitting layer 510 provided on the bank 400 between the second subpixel SP2 and the third subpixel SP3 may be formed through the same process, and particularly, may be formed prior to the second light emitting layer 520 and the third light emitting layer 530. Accordingly, the first light emitting layer 510 may be provided under the second light emitting layer 520 and the third light emitting layer 530, between the second subpixel SP2 and the third subpixel SP3.

The second light emitting layer 520 may be further provided on the bank 400 between the third subpixel SP3 and the first subpixel SP1. In this case, the second light emitting layer 520 may be provided under the third light emitting layer 530 and on the first light emitting layer 510, between the third subpixel SP3 and the first subpixel SP1. Therefore, a portion of a lower surface of the second light emitting layer 520 may contact the upper surface 420 of the bank 400 and the other portion of the lower surface of the second light emitting layer 520 may contact the upper surface of the first light emitting layer 510, between the third subpixel SP3 and the first subpixel SP1, and in this case, the upper surface of the second light emitting layer 520 may contact a lower surface of the third light emitting layer 530 and may not contact the lower surface of the first light emitting layer 510.

The second light emitting layer 520 provided on the first electrode 300 of the second subpixel SP2 and the second light emitting layer 520 provided on the bank 400 between the third subpixel SP3 and the first subpixel SP1 may be formed through the same process, and particularly, may be formed after the first light emitting layer 510 is formed and before the third light emitting layer 530 is formed. Accordingly, the second light emitting layer 520 may be provided under the third light emitting layer 530 and on the first light emitting layer 510, between the third subpixel SP3 and the first subpixel SP1.

The third light emitting layer 530 may be further provided on the bank 400 between the first subpixel SP1 and the second subpixel SP2. In this case, the third light emitting layer 530 may be provided on the first light emitting layer 510 and the second light emitting layer 520, between the first subpixel SP1 and the second subpixel SP2. Therefore, the lower surface of the third light emitting layer 530 may contact the upper surface 420 of the bank 400, the upper surface of the first light emitting layer 510 and the upper surface of the second light emitting layer 520, and an upper surface of the third light emitting layer 530 may not contact the first light emitting layer 510 and the second light emitting layer 520, between the first subpixel SP1 and the second subpixel SP2.

The third light emitting layer 530 provided on the first electrode 300 of the third subpixel SP3 and the third light emitting layer 530 provided on the bank 400 between the first subpixel SP1 and the second subpixel SP2 may be formed through the same process, and particularly, may be formed after the first light emitting layer 510 and the second light emitting layer 520 are formed. Accordingly, the third light emitting layer 530 may be provided on the first light emitting layer 510 and the second light emitting layer 520, between the first subpixel SP1 and the second subpixel SP2.

FIGS. 6A to 6H are manufacturing process views of an electroluminescent display apparatus according to another aspect of the present disclosure and relates a process of manufacturing the above-described electroluminescent display apparatus of FIG. 5.

Figure 6A:
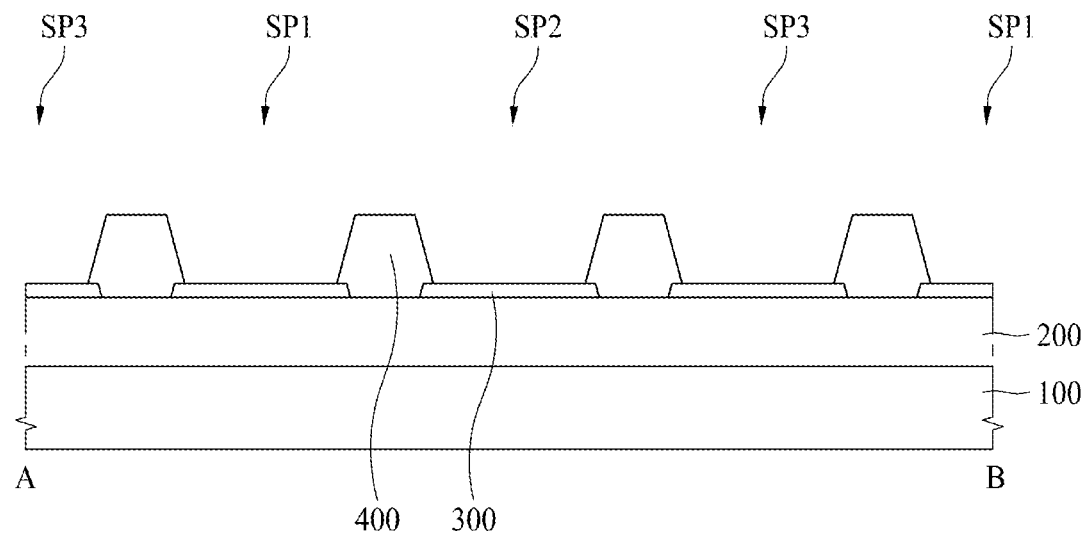
FIGS. 6A to 6H are manufacturing process views of an electroluminescent display apparatus according to another aspect of the present disclosure.

First, as seen in FIG. 6A, a circuit device layer 200 may be formed on a substrate 100, a first electrode 300 may be formed on the circuit device layer 200 in each of subpixels (for example, first to third subpixels) SP1 to SP3, and a bank 400 may be formed to cover an edge of the first electrode 300.

Figure 6B:
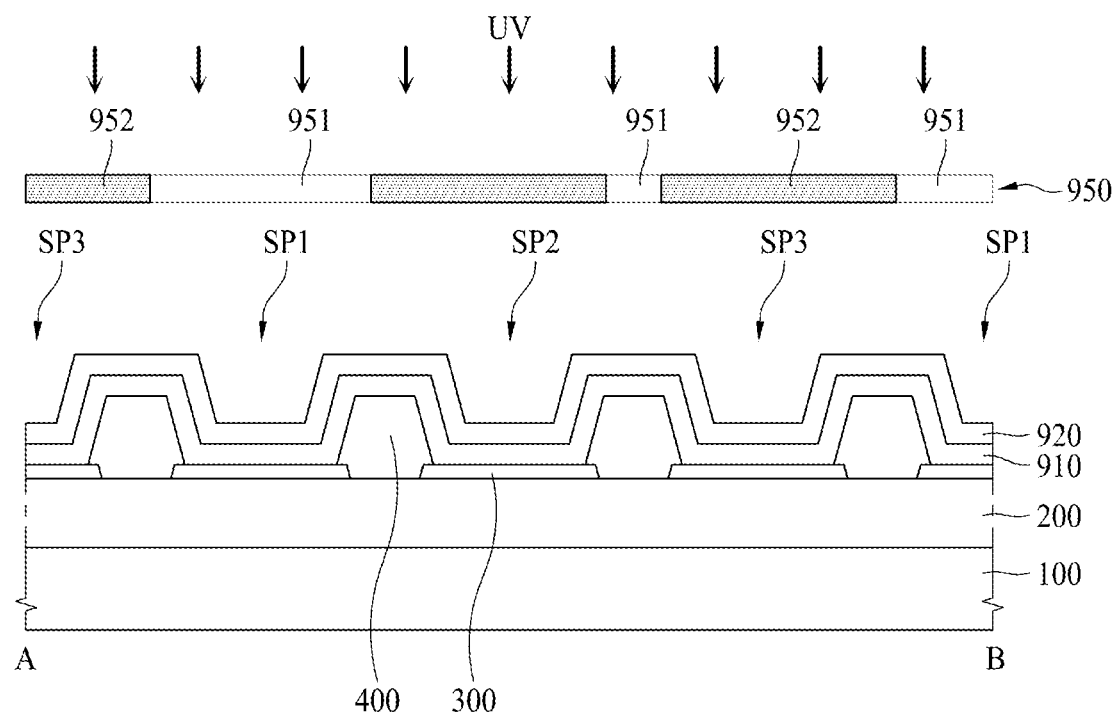

Subsequently, as seen in FIG. 6B, a shield layer 910 and a photoresist layer 920 may be sequentially formed on the first electrode 300 and the bank 400, and then, light may be irradiated onto the photoresist layer 920 in a state where the second subpixel SP2 area and the third subpixel SP3 are covered by a mask 950.

The mask 950 may include an open portion 951 which transmits light and a light blocking portion 952 which blocks the light. In this case, the open portion 951 may correspond to the first subpixels SP1 area and an area between the second subpixel SP2 and the third subpixel SP3, and the light blocking portion 952 may correspond to the second subpixel SP2 area and the third subpixel SP3 area. Therefore, the light may pass through only the open portion 951 and may be irradiated onto the first subpixel SP1 area and the area between the second subpixel SP2 and the third subpixel SP3 without being irradiated onto the second subpixel SP2 area and the third subpixel SP3 area.

Figure 6C:
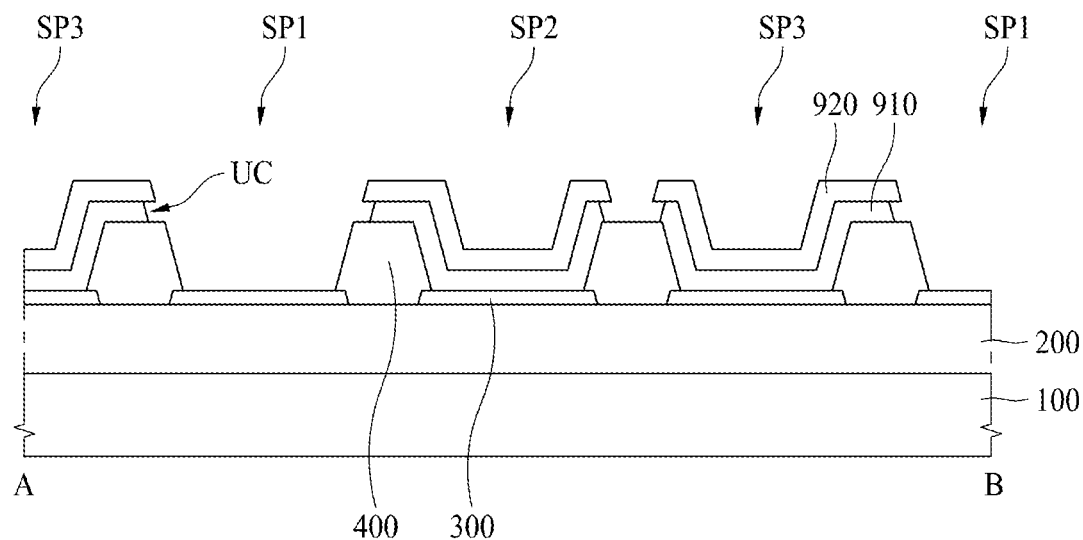

Subsequently, as seen in FIG. 6C, a development process may be performed on the shield layer 910 and the photoresist layer 920 by using a solvent. Therefore, the shield layer 910 and the photoresist layer 920 each provided in the first subpixel SP1 area and the area between the second subpixel SP2 and the third subpixel SP3 where light was irradiated may be removed, and the shield layer 910 and the photoresist layer 920 which are provided in each of the second subpixel SP2 area and the third subpixel SP3 area where light was not irradiated may remain. Accordingly, an upper surface of the first electrode 300 of the first subpixel SP1, an upper surface of a portion of the bank 400 adjacent to the first subpixel SP1, and an upper surface of a portion of the bank 400 between the second subpixel SP2 and the third subpixel SP3 may be exposed.

At this time, the shield layer 910 may be more removed than the photoresist layer 920, and thus, an undercut structure may be formed under the photoresist layer 920.

Figure 6D:
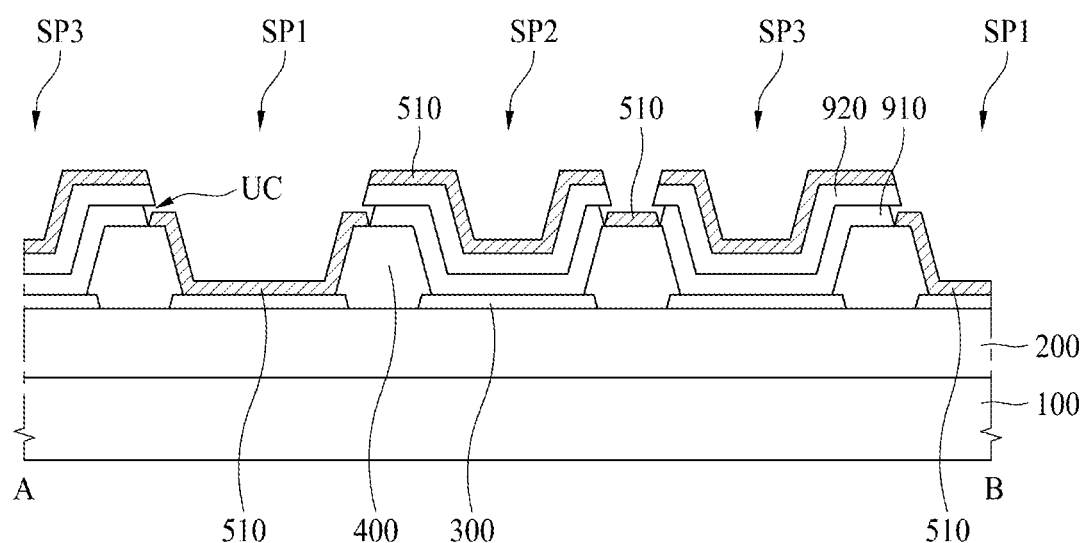

Subsequently, as seen in FIG. 6D, a first light emitting layer 510 may be deposited on the upper surface of the first electrode 300 of the first subpixel SP1, the upper surface of the portion of the bank 400 adjacent to the first subpixel SP1, the upper surface of the portion of the bank 400 between the second subpixel SP2 and the third subpixel SP3, and an upper surface of the remaining photoresist layer 920.

Figure 6E:
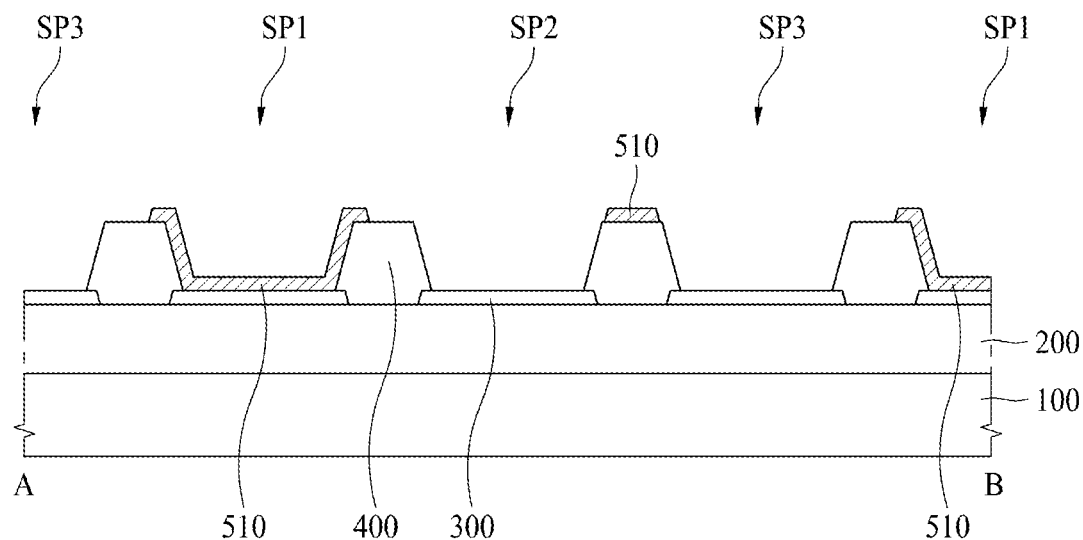

Subsequently, as seen in FIG. 6E, the shield layer 910, the photoresist layer 920, and the first light emitting layer 510 each deposited in the second subpixel SP2 area and the third subpixel SP3 area may be removed through a liftoff process by using a solvent. Therefore, the first light emitting layer 510 may be formed on only the upper surface of the first electrode 300 of the first subpixel SP1, the upper surface of the portion of the bank 400 adjacent to the first subpixel SP1, and the upper surface of the portion of the bank 400 between the second subpixel SP2 and the third subpixel SP3.

Subsequently, the above-described processes of FIGS. 6B to 6E may be repeated, and as in FIG. 6B, light may be irradiated by using a mask 950 which includes an open portion 951 corresponding to the second subpixel SP2 area and an area between the third subpixel SP3 and the first subpixel SP1 and a light blocking portion 952 corresponding to the first subpixel SP1 area and the third subpixel SP3 area.

Figure 6F:
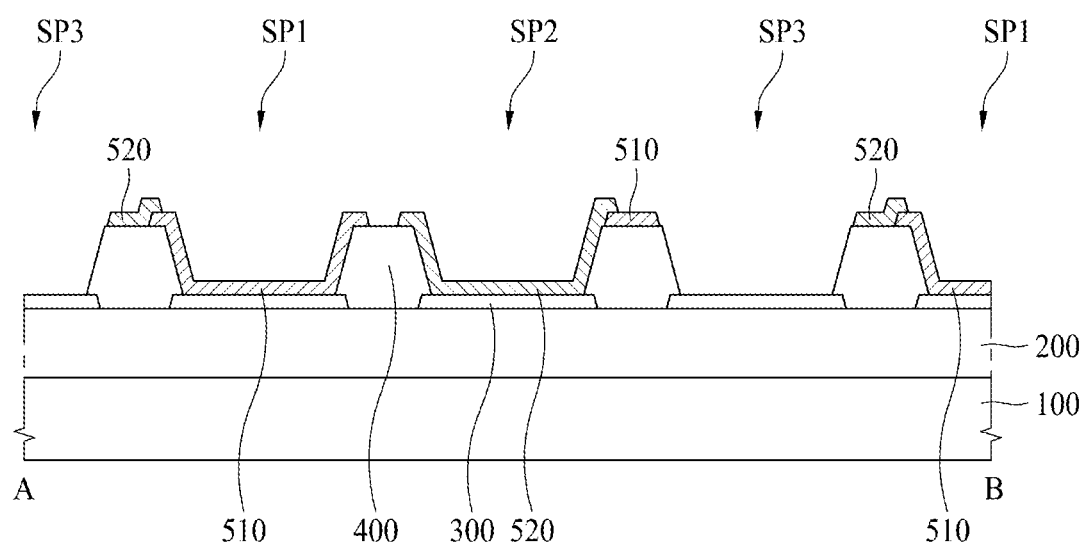

Therefore, as in FIG. 6F, a second light emitting layer 520 may be formed on only an upper surface of the first electrode 300 of the second subpixel SP2, an upper surface of a portion of the bank 400 adjacent to the second subpixel SP2, and an upper surface of a portion of the bank 400 between the third subpixel SP3 and the first subpixel SP1. In this case, the second light emitting layer 520 may extend from the upper surface of the portion of the bank 400 between the third subpixel SP3 and the first subpixel SP1 to an upper surface of the first light emitting layer 510.

Subsequently, the above-described processes of FIGS. 6B to 6E may be repeated, and as in FIG. 6B, light may be irradiated by using a mask 950 which includes an open portion 951 corresponding to the third subpixel SP3 area and an area between the first subpixel SP1 and the second subpixel SP2 and a light blocking portion 952 corresponding to the first subpixel SP1 area and the second subpixel SP2 area.

Figure 6G:
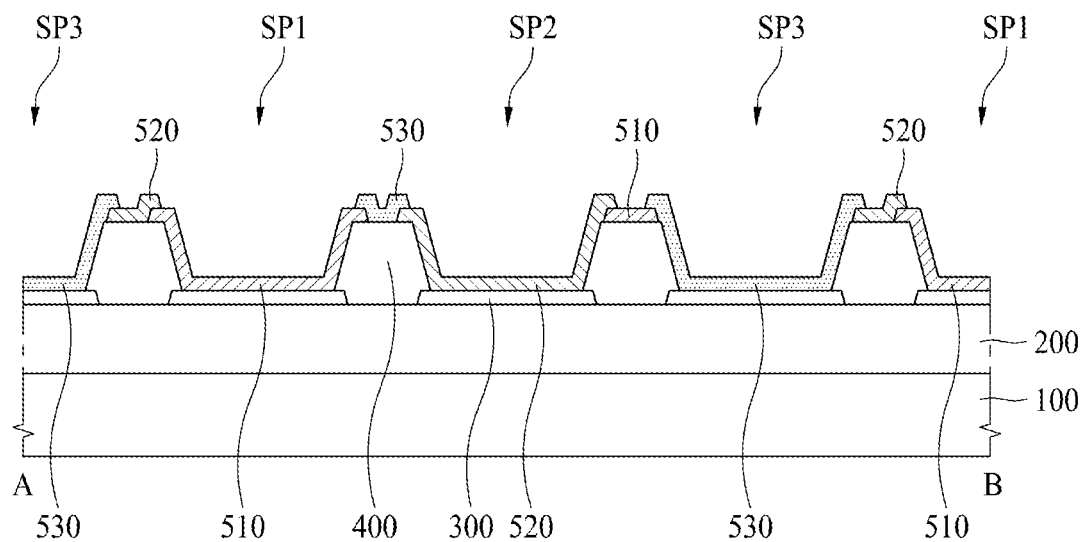

Therefore, as in FIG. 6G, a third light emitting layer 530 may be formed on only an upper surface of the first electrode 300 of the third subpixel SP3, an upper surface of a portion of the bank 400 adjacent to the third subpixel SP3, and an upper surface of a portion of the bank 400 between the first subpixel SP1 and the second subpixel SP2. In this case, the third light emitting layer 530 may extend from the upper surface of the portion of the bank 400 between the first subpixel SP1 and the second subpixel SP2 to an upper surface of each of the first and second light emitting layers 510 and 520.

Figure 6H:
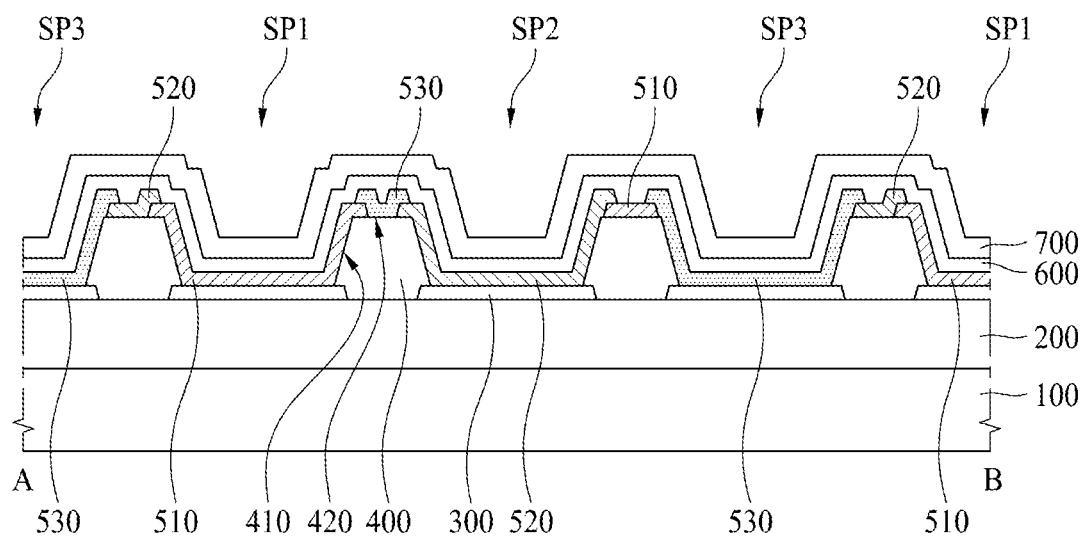

Subsequently, as seen in FIG. 6H, a second electrode 600 may be formed on the light emitting layers 510 to 530 and the bank 400, and an encapsulation layer 700 may be formed on the second electrode 600.

As described above, according to another aspect of the present disclosure, in the above-described process of FIG. 6E, when the shield layer 910, the photoresist layer 920, and the first light emitting layer 510 each deposited in the second subpixel SP2 area and the third subpixel SP3 area is detached from the substrate 100 by applying a solvent, a solvent penetration space which enables the solvent to penetrate into a lower surface of the shield layer 910 may extend to an area between the second subpixel SP2 and the third subpixel SP3 as well as the first subpixel SP1. Accordingly, a time for which the solvent is applied may decrease, and moreover, the shield layer 910, the photoresist layer 920, and the first light emitting layer 510 each deposited in the second subpixel SP2 area and the third subpixel SP3 area may be easily removed.

Figure 7:
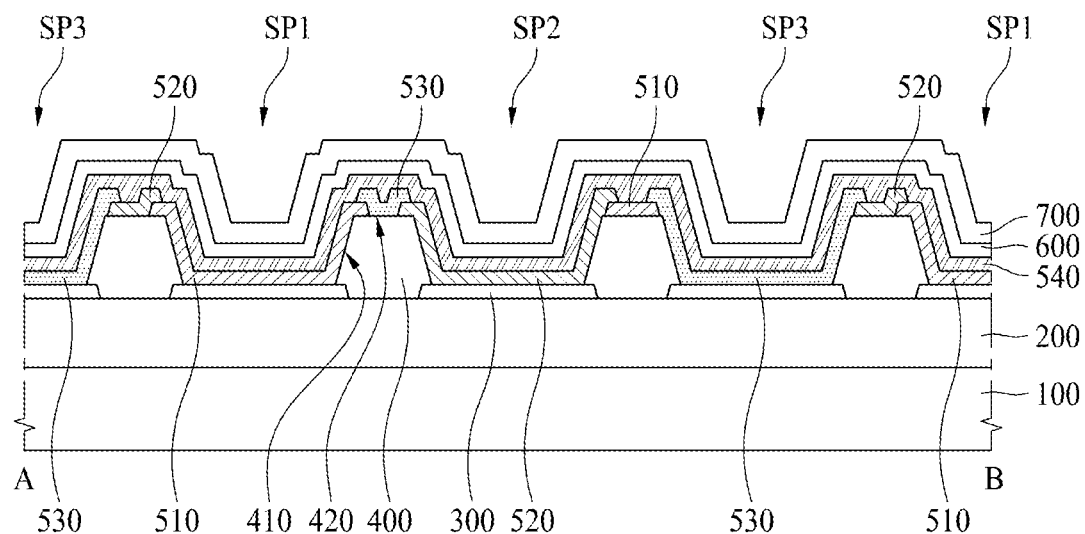
FIG. 7 is a cross-sectional view of an electroluminescent display apparatus according to another aspect of the present disclosure and is a cross-sectional view according to another aspect taken along line A-B of FIG. 4.

FIG. 7 is a cross-sectional view of an electroluminescent display apparatus according to another aspect of the present disclosure. Except for those configurations of light emitting layers 510 to 540 are changed, the electroluminescent display apparatus of FIG. 7 is the same as the electroluminescent display apparatus of FIG. 5. Therefore, like reference numerals refer to like elements. Hereinafter, only different elements will be described.

Referring to FIG. 7, a plurality of light emitting layers 510 to 540 may include a first light emitting layer 510, a second light emitting layer 520, a third light emitting layer 530, and a fourth light emitting layer 540.

Positions of the first light emitting layer 510, the second light emitting layer 520, and the third light emitting layer 530 are as described above with reference to FIG. 5. However, a stacked structure of each of the first light emitting layer 510, the second light emitting layer 520, and the third light emitting layer 530 differs from FIG. 5.

In detail, the first light emitting layer 510 may be provided to have a structure where a hole injecting layer, a hole transporting layer, and a red organic light emitting layer are sequentially stacked, the second light emitting layer 520 may be provided to have a structure where a hole injecting layer, a hole transporting layer, and a green organic light emitting layer are sequentially stacked, and the third light emitting layer 530 may be provided to have a structure where a hole injecting layer, a hole transporting layer, and a blue organic light emitting layer are sequentially stacked. Also, each of the first to third light emitting layers 510 to 530 may further includes an electron blocking layer provided between the hole transporting layer and the red/green/blue organic light emitting layer and may further include a hole blocking layer provided between the red/green/blue organic light emitting layer and the electron transporting layer. In this case, each of the first to third light emitting layers 510 to 530 may not include an electron transporting layer or an electron injecting layer. In another example, each of the first to third light emitting layers 510 to 530 may further include the electron transporting layer, and in this case, may not include the electron injecting layer.

The fourth light emitting layer 540 may be provided on an upper surface of each of the first light emitting layer 510, the second light emitting layer 520, and the third light emitting layer 530. The fourth light emitting layer 540 may be provided in all of the first subpixel SP1, the second subpixel SP2, the third subpixel SP3, and a boundary region between the plurality of subpixels SP1 to SP3. Accordingly, the fourth light emitting layer 540 may be provided all over an upper surface of the substrate 100, and thus, a separate patterning process is not needed.

The fourth light emitting layer 540 may be provided to have a stacked structure of a hole blocking layer, an electron transporting layer, and an electron injecting layer, provided to have a stacked structure of an electron transporting layer and an electron injecting layer, or provided to have a structure including only an electron injecting layer.

Referring to FIG. 7, the first subpixel SP1 may emit light (for example, red light) of a first color by using a combination of the first light emitting layer 510 and the fourth light emitting layer 540, the second subpixel SP2 may emit light (for example, green light) of a second color by using a combination of the second light emitting layer 520 and the fourth light emitting layer 540, and the third subpixel SP3 may emit light (for example, blue light) of a third color by using a combination of the third light emitting layer 530 and the fourth light emitting layer 540.

Figure 8:
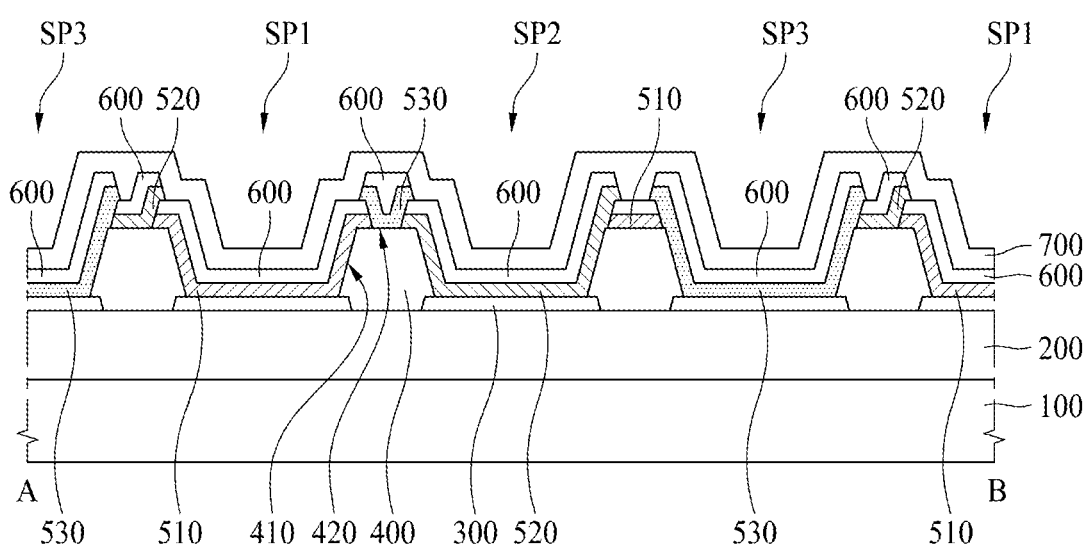
FIG. 8 is a cross-sectional view of an electroluminescent display apparatus according to another aspect of the present disclosure and is a cross-sectional view according to another aspect taken along line A-B of FIG. 4.

FIG. 8 is a cross-sectional view of an electroluminescent display apparatus according to another aspect of the present disclosure. Except for that a configuration of a second electrode 600 is changed, the electroluminescent display apparatus of FIG. 8 is the same as the electroluminescent display apparatus of FIG. 5. Therefore, like reference numerals refer to like elements. Hereinafter, only different elements will be described.

Referring to FIG. 8, a second electrode 600 may be simultaneously formed on a first light emitting layer 510, a second light emitting layer 520, and a third light emitting layer 530 to have the same pattern as that of each of the first light emitting layer 510, the second light emitting layer 520, and the third light emitting layer 530.

In detail, the second electrode 600 may have the same pattern as that of the first light emitting layer 510 in the first subpixel SP1, the second electrode 600 may have the same pattern as that of the second light emitting layer 520 in the second subpixel SP2, and the second electrode 600 may have the same pattern as that of the third light emitting layer 530 in the third subpixel SP3.

Moreover, the second electrode 600 may be provided between the first subpixel SP1 and the second subpixel SP2 to have the same pattern as that of the third light emitting layer 530, the second electrode 600 may be provided between the second subpixel SP2 and the third subpixel SP3 to have the same pattern as that of the first light emitting layer 510, and the second electrode 600 may be provided between the third subpixel SP3 and the first subpixel SP1 to have the same pattern as that of the second light emitting layer 520.

Therefore, the first light emitting layer 510, the second electrode 600, the third light emitting layer 530, and the second electrode 600 may be sequentially formed on a portion (for example, a left portion) of an upper surface of the bank 400 between the first subpixel SP1 and the second subpixel SP2, and the second light emitting layer 520, the second electrode 600, the third light emitting layer 530, and the second electrode 600 may be sequentially formed on another portion (for example, a right portion) of the upper surface of the bank 400 between the first subpixel SP1 and the second subpixel SP2.

Moreover, the first light emitting layer 510, the second electrode 600, the second light emitting layer 520, and the second electrode 600 may be sequentially formed on a portion (for example, a left portion) of an upper surface of the bank 400 between the second subpixel SP2 and the third subpixel SP3, and the first light emitting layer 510, the second electrode 600, the third light emitting layer 530, and the second electrode 600 may be sequentially formed on another portion (for example, a right portion) of the upper surface of the bank 400 between the second subpixel SP2 and the third subpixel SP3.

Moreover, the second light emitting layer 520, the second electrode 600, the third light emitting layer 530, and the second electrode 600 may be sequentially formed on a portion (for example, a left portion) of an upper surface of the bank 400 between the third subpixel SP3 and the first subpixel SP1, and the first light emitting layer 510, the second electrode 600, the second light emitting layer 520, and the second electrode 600 may be sequentially formed on another portion (for example, a right portion) of the upper surface of the bank 400 between the third subpixel SP3 and the first subpixel SP1.

The second electrode 600 provided between the first subpixel SP1 and the second subpixel SP2, the second electrode 600 provided between the second subpixel SP2 and the third subpixel SP3, and the second electrode 600 provided between the third subpixel SP3 and the first subpixel SP1 may not each function as a cathode of the electroluminescent display apparatus, and the second electrode 600 included in each of the plurality of subpixels SP1 to SP3 may function as the cathode of the electroluminescent display apparatus. Although not shown in detail, the second electrodes 600 included in the plurality of subpixels SP1 to SP3 functioning as the cathode may be electrically connected to one another through a separate conductive line.

Although not shown, the structure of each of the first to fourth light emitting layers 510 to 540 illustrated in FIG. 7 may be applied to a structure of FIG. 8.

Figure 9:
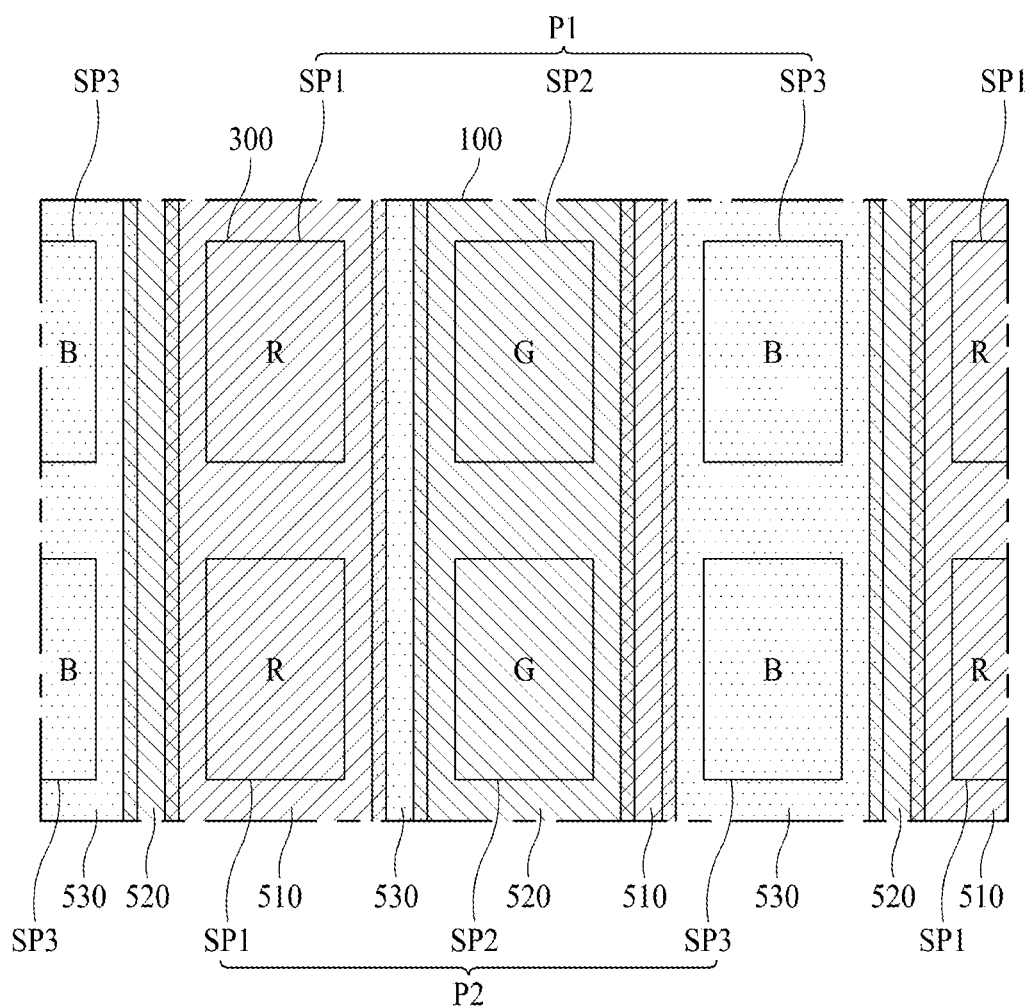
FIG. 9 is a schematic plan view of an electroluminescent display apparatus according to another aspect of the present disclosure.

FIG. 9 is a schematic plan view of an electroluminescent display apparatus according to another aspect of the present disclosure.

As seen in FIG. 9, the electroluminescent display apparatus according to another aspect of the present disclosure may include a substrate 100, a first electrode 300, and a plurality of light emitting layers 510 to 530.

A plurality of pixels P1 and P2 may be provided in the substrate 100.

The plurality of pixels P1 and P2 may include a first pixel P1 and a second pixel P2 which are adjacent to each other. In the drawing, only two pixels P1 and P2 adjacent to each other in a lengthwise direction are illustrated, but the plurality of pixels P1 and P2 are arranged in a widthwise direction and the lengthwise direction.

Each of the plurality of pixels P1 and P2 may include a plurality of subpixels SP1 to SP3. The plurality of subpixels SP1 to SP3 may include a first subpixel SP1 provided to emit light (for example, red (R) light) having a first color, a second subpixel SP2 provided to emit light (for example, green (G) light) having a second color, and a third subpixel SP3 provided to emit light (for example, blue (B) light) having a third color.

The first electrode 300 may be patterned in each of the plurality of subpixels SP1 to SP3.

The light emitting layers 510 to 530 may include a first light emitting layer 510 provided in the first subpixel SP1, a second light emitting layer 520 provided in the second subpixel SP2, and a third light emitting layer 530 provided in the third subpixel SP3.

The first light emitting layer 510 provided in the first subpixel SP1 of the first pixel P1 may be connected to the first light emitting layer 510 provided in the first subpixel SP1 of the second pixel P2. That is, the first light emitting layer 510 may be provided in a boundary region between the first pixel P1 and the second pixel P2. Also, the second light emitting layer 520 provided in the second subpixel SP2 of the first pixel P1 may be connected to the second light emitting layer 520 provided in the second subpixel SP2 of the second pixel P2. That is, the second light emitting layer 520 may be provided in the boundary region between the first pixel P1 and the second pixel P2. Also, the third light emitting layer 530 provided in the third subpixel SP3 of the first pixel P1 may be connected to the third light emitting layer 530 provided in the third subpixel SP3 of the second pixel P2. That is, the third light emitting layer 530 may be provided in the boundary region between the first pixel P1 and the second pixel P2.

In this manner, referring to FIG. 9, the first light emitting layer 510, the second light emitting layer 520, and the third light emitting layer 530 may extend in a first direction (for example, a vertical direction) in the subpixels SP1 to SP3, and thus, the light emitting layers 510 to 530 may be wholly provided in a stripe structure.

Similar to FIG. 4, the first light emitting layer 510 may be further provided between the second subpixel SP2 and the third subpixel SP3 and may overlap the second light emitting layer 520 and the third light emitting layer 530. Also, the second light emitting layer 520 may be further provided between the third subpixel SP3 and the first subpixel SP1 and may overlap the third light emitting layer 530 and the first light emitting layer 510. Also, the third light emitting layer 530 may be further provided between the first subpixel SP1 and the second subpixel SP2 and may overlap the first light emitting layer 510 and the second light emitting layer 520.

Particularly, the first light emitting layer 510 further provided between the second subpixel SP2 and the third subpixel SP3 may be continuously provided in the first pixel P1, the second pixel P2, and a boundary between the first pixel P1 and the second pixel P2. Also, the second light emitting layer 520 further provided between the third subpixel SP3 and the first subpixel SP1 may be continuously provided in the first pixel P1, the second pixel P2, and the boundary between the first pixel P1 and the second pixel P2. Also, the third light emitting layer 530 further provided between the first subpixel SP1 and the second subpixel SP2 may be continuously provided in the first pixel P1, the second pixel P2, and the boundary between the first pixel P1 and the second pixel P2.

Therefore, the first light emitting layer 510, the second light emitting layer 520, and the third light emitting layer 530 may extend in the first direction between the subpixels SP1 to SP3, and thus, may be wholly provided in a stripe structure.

The structure of each of the first light emitting layer 510, the second light emitting layer 520, the third light emitting layer 530, the fourth light emitting layer 540, and the second electrode 600 each illustrated in FIGS. 5, 7, and 8 may be variously applied to the structure of FIG. 9. This is similar to a below-described aspect.

Figure 10:
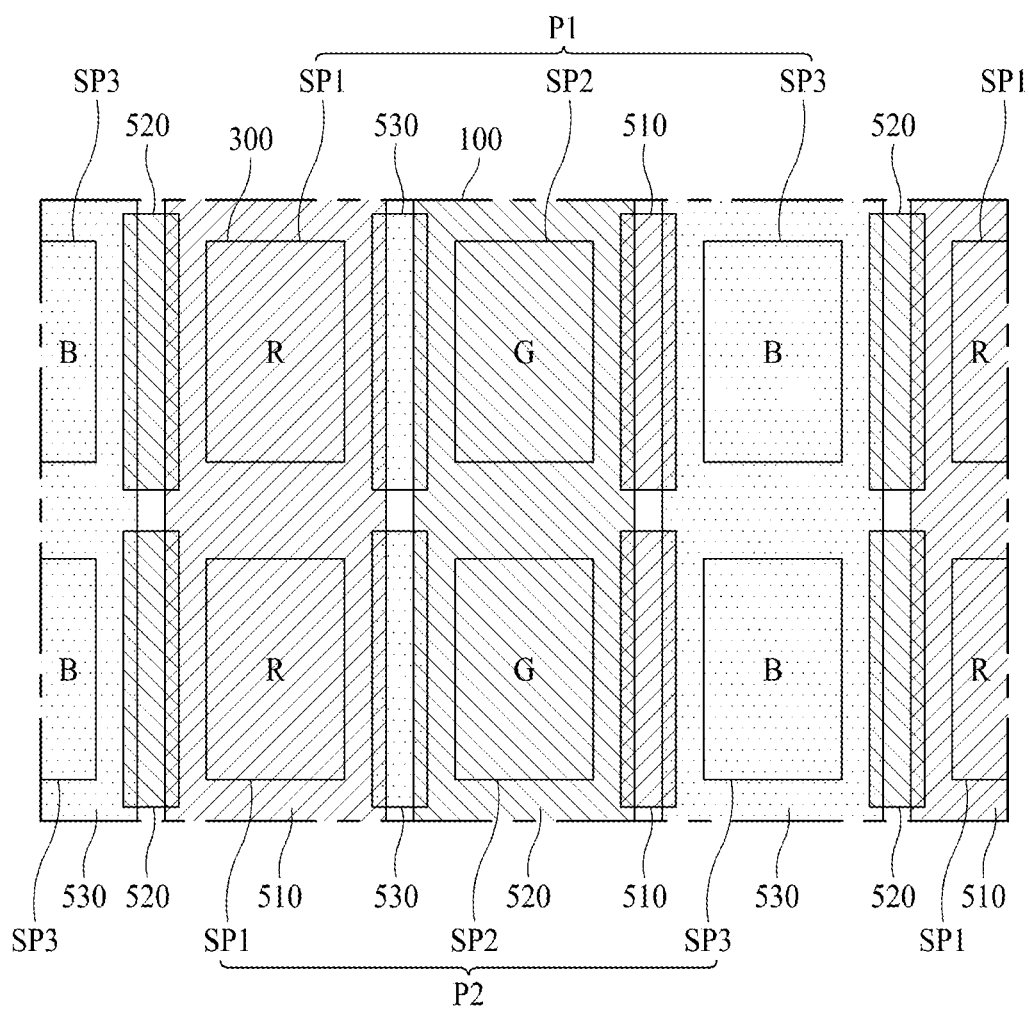
FIG. 10 is a schematic plan view of an electroluminescent display apparatus according to another aspect of the present disclosure.

FIG. 10 is a schematic plan view of an electroluminescent display apparatus according to another aspect of the present disclosure. Except for that configurations of first to third light emitting layers 510 to 530 provided between subpixels SP1 to SP3 are changed, the electroluminescent display apparatus of FIG. 10 is the same as the electroluminescent display apparatus of FIG. 9. Hereinafter, therefore, only different elements will be described.

As seen in FIG. 10, a first light emitting layer 510 further provided between the second subpixel SP2 and the third subpixel SP3 may be provided in the first pixel P1 and the second pixel P2, but may not be provided in a boundary between the first pixel P1 and the second pixel P2. Therefore, a first light emitting layer 510 provided between the second subpixel SP2 and the third subpixel SP3 of the first pixel P1 may be spaced apart from a first light emitting layer 510 provided between the second subpixel SP2 and the third subpixel SP3 of the second pixel P2.

Moreover, a second light emitting layer 520 further provided between the third subpixel SP3 and the first subpixel SP1 may be provided in the first pixel P1 and the second pixel P2, but may not be provided in the boundary between the first pixel P1 and the second pixel P2. Therefore, a second light emitting layer 520 provided between the third subpixel SP3 and the first subpixel SP1 of the first pixel P1 may be spaced apart from a second light emitting layer 520 provided between the third subpixel SP3 and the first subpixel SP1 of the second pixel P2.

Moreover, a third light emitting layer 530 further provided between the first subpixel SP1 and the second subpixel SP2 may be provided in the first pixel P1 and the second pixel P2, but may not be provided in the boundary between the first pixel P1 and the second pixel P2. Therefore, a third light emitting layer 530 provided between the first subpixel SP1 and the second subpixel SP2 of the first pixel P1 may be spaced apart from a third light emitting layer 530 provided between the first subpixel SP1 and the second subpixel SP2 of the second pixel P2.

Referring to FIGS. 6B to 6E, regions of the light emitting layers 510 to 530 further provided between the subpixels SP1 to SP3 may be regions from which the shield layer 910 and the photoresist layer 920 are removed, and due to the regions, a solvent penetration space may increase in a liftoff process. Therefore, when the regions from which the shield layer 910 and the photoresist layer 920 are removed increase, the solvent penetration space may increase in the liftoff process.

However, as in FIG. 9, when the regions from which the shield layer 910 and the photoresist layer 920 are removed configure a structure which is continued in a vertical direction, there is a possibility that the shield layer 910 remaining in each of the subpixels SP1 to SP3 is stripped before the liftoff process.

To provide in a detailed description, the shield layer 910 may be configured so that an adhesive force to a lower layer thereunder is not large so as to be easily removed through a subsequent liftoff process. In this case, when the regions from which the shield layer 910 and the photoresist layer 920 are removed configure a structure which is continued in the vertical direction, the shield layers 910 remaining in the subpixels SP1 to SP3 may be spaced apart from one another, and thus, there is a possibility that the remaining shield layers 910 are stripped before the liftoff process.

Therefore, in FIG. 10, the regions (i.e., regions of the light emitting layers 510 to 530 further provided between the subpixels SP1 to SP3) from which the shield layer 910 and the photoresist layer 920 are removed may be configured to be disconnected in a boundary between the first pixel P1 and the second pixel P2, instead of a structure which is continued in the vertical direction. Accordingly, the shield layers 910 remaining in the subpixels SP1 to SP3 may be connected to one another through the boundary between the first pixel P1 and the second pixel P2, and thus, may not easily be stripped before the liftoff process.

Figure 11:
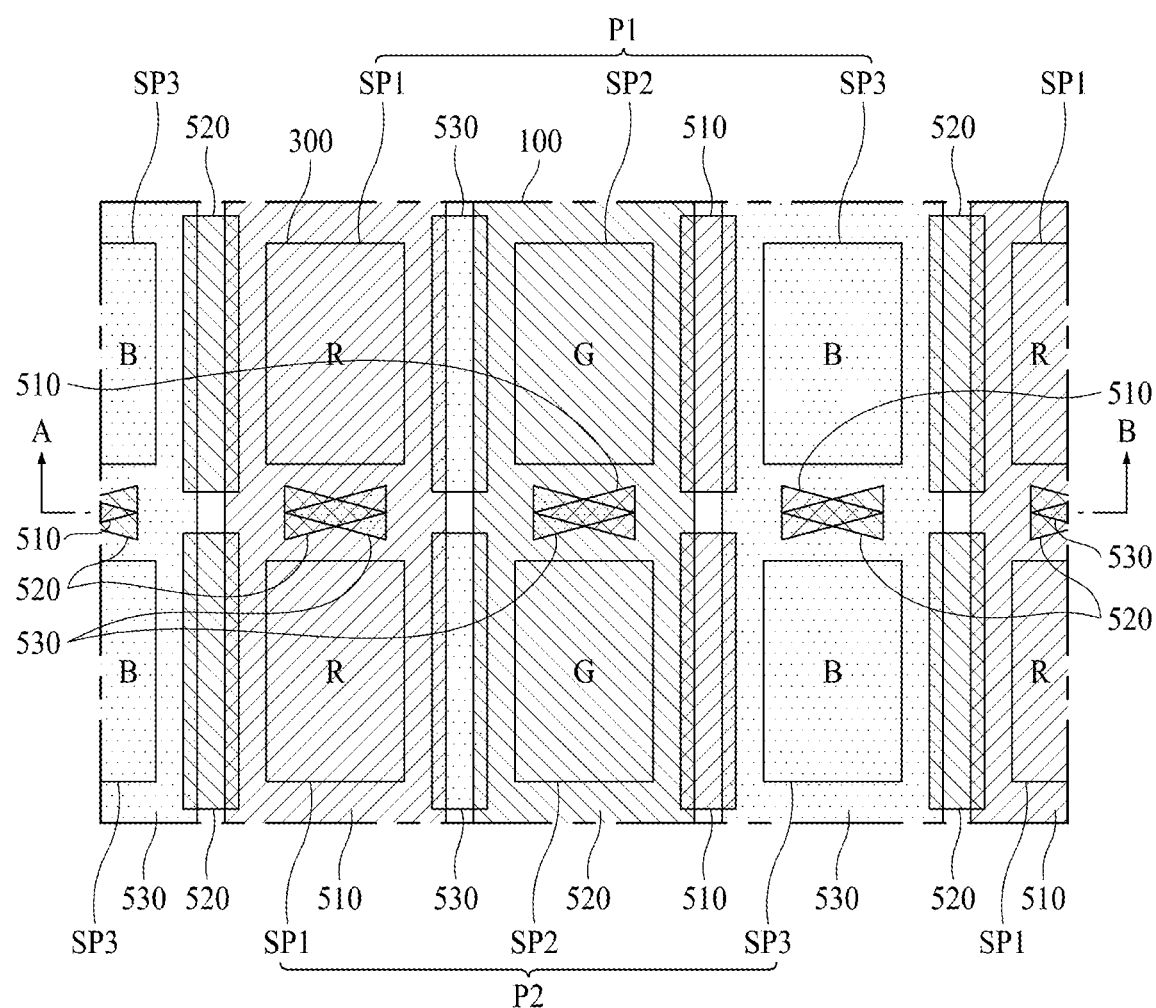
FIG. 11 is a schematic plan view of an electroluminescent display apparatus according to another aspect of the present disclosure.

FIG. 11 is a schematic plan view of an electroluminescent display apparatus according to another aspect of the present disclosure. Except for that light emitting layers 510 to 530 are further provided between pixels P1 and SP2, the electroluminescent display apparatus of FIG. 11 is the same as the electroluminescent display apparatus of FIG. 10.

As seen in FIG. 11, a second light emitting layer 520 and a third light emitting layer 530 may be further provided in a boundary between a first subpixel SP1 of a first pixel P1 and a first subpixel SP1 of a second pixel P2. In this case, in the boundary between the first subpixel SP1 of the first pixel P1 and the first subpixel SP1 of the second pixel P2, the second light emitting layer 520 may be provided under the third light emitting layer 530, and the second light emitting layer 520 and the third light emitting layer 530 may be configured in an angular structure which is symmetrical with each other.

Moreover, a first light emitting layer 510 and a third light emitting layer 530 may be provided in a boundary between a second subpixel SP2 of the first pixel P1 and a second subpixel SP2 of the second pixel P2. In this case, in the boundary between the second subpixel SP2 of the first pixel P1 and the second subpixel SP2 of the second pixel P2, the first light emitting layer 510 may be provided under the third light emitting layer 530, and the first light emitting layer 510 and the third light emitting layer 530 may be configured in an angular structure which is symmetrical with each other.

Moreover, a first light emitting layer 510 and a second light emitting layer 520 may be provided in a boundary between a third subpixel SP3 of the first pixel P1 and a third subpixel SP3 of the second pixel P2. In this case, in the boundary between the third subpixel SP3 of the first pixel P1 and the third subpixel SP3 of the second pixel P2, the first light emitting layer 510 may be provided under the second light emitting layer 520, and the first light emitting layer 510 and the second light emitting layer 520 may be configured in an angular structure which is symmetrical with each other.

The second and third light emitting layers 520 and 530 provided in the boundary between the first subpixel SP1 of the first pixel P1 and the first subpixel SP1 of the second pixel P2, the first and third light emitting layers 510 and 530 provided in the boundary between the second subpixel SP2 of the first pixel P1 and the second subpixel SP2 of the second pixel P2, and the first and second light emitting layers 510 and 520 provided in the boundary between the third subpixel SP3 of the first pixel P1 and the third subpixel SP3 of the second pixel P2 may be spaced apart from one another without being connected.

Figure 12A:
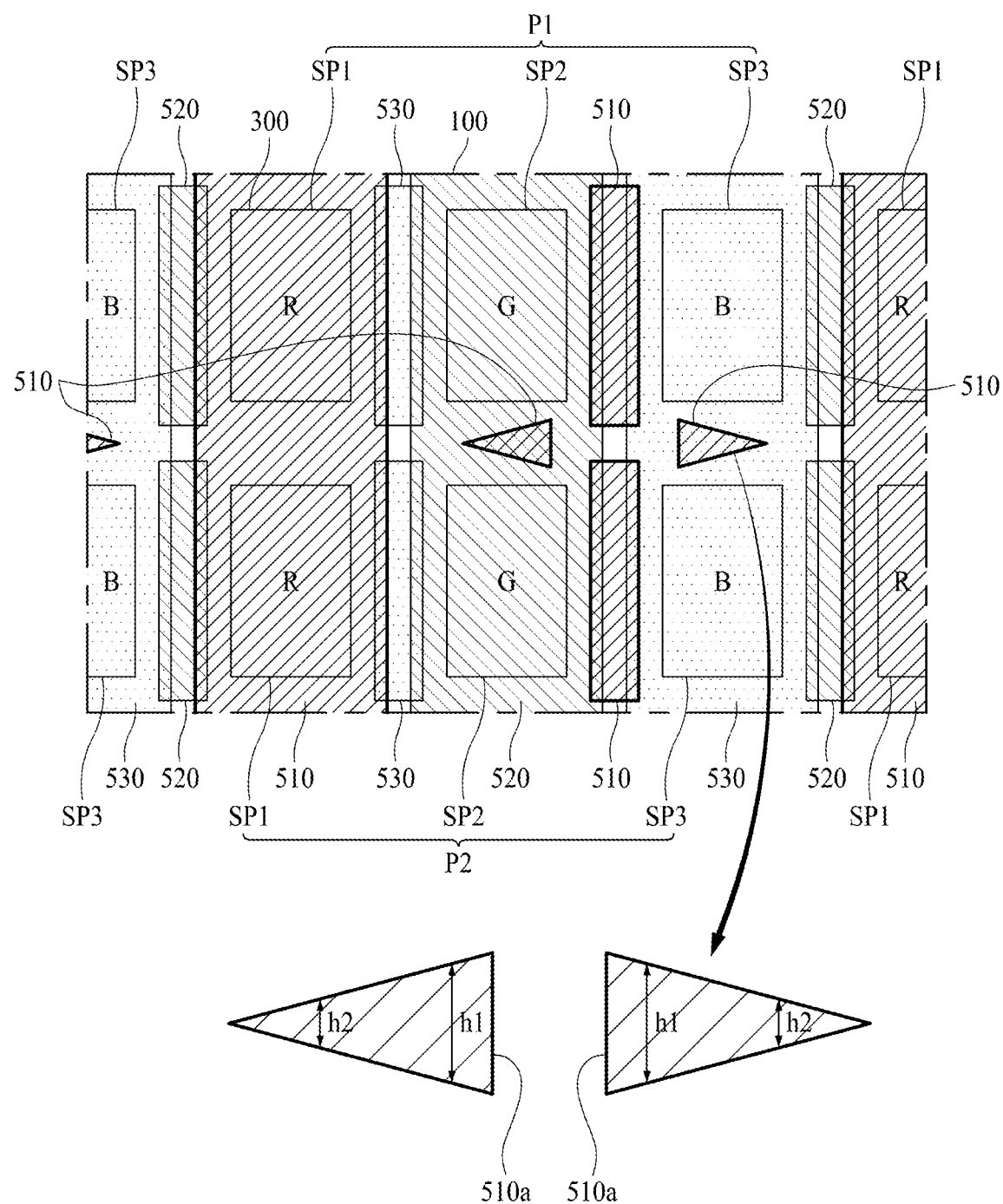
FIGS. 12A to 12C are process views illustrating a process of manufacturing the electroluminescent display apparatus of FIG. 11.
Figure 12B:
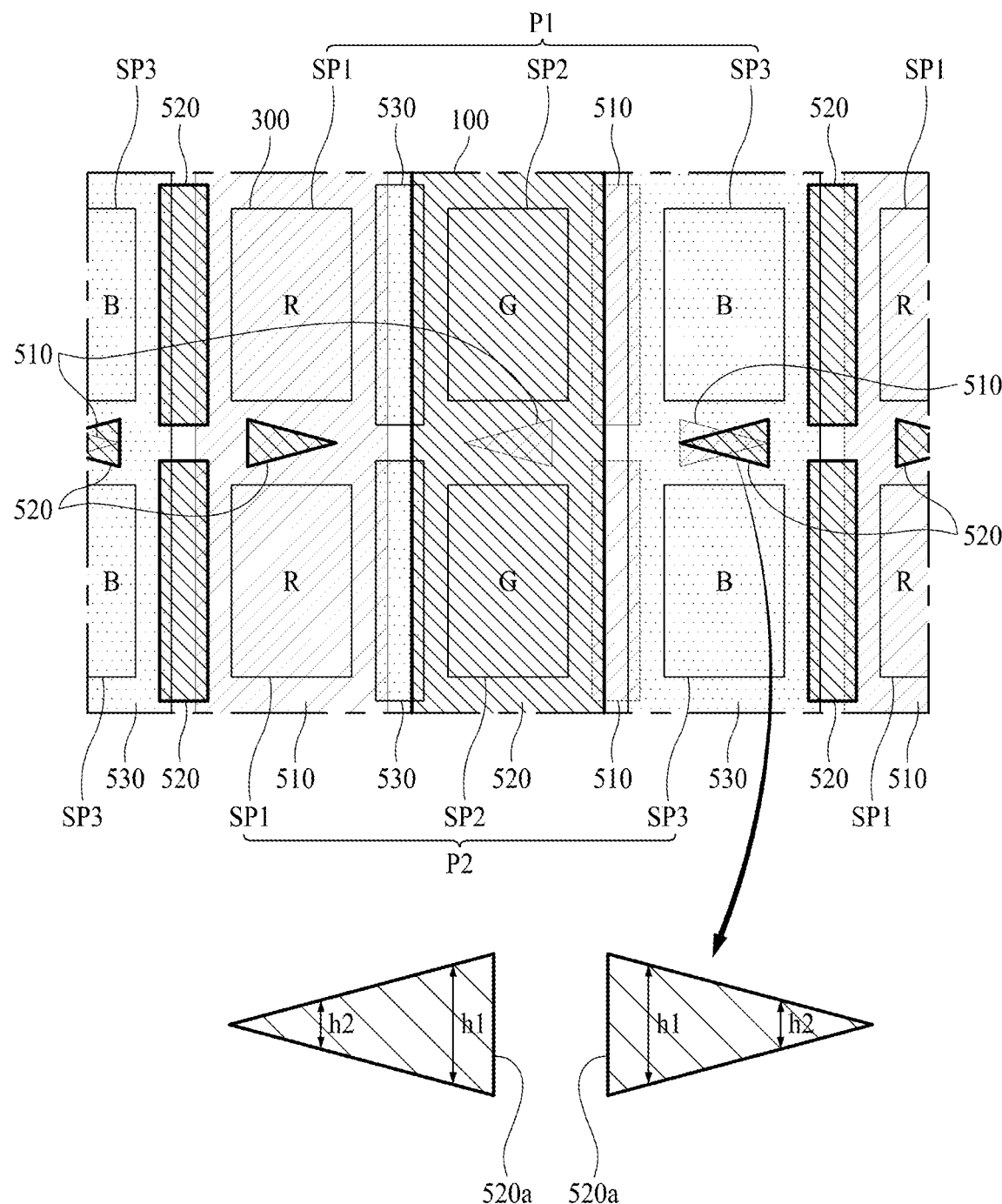
Figure 12C:
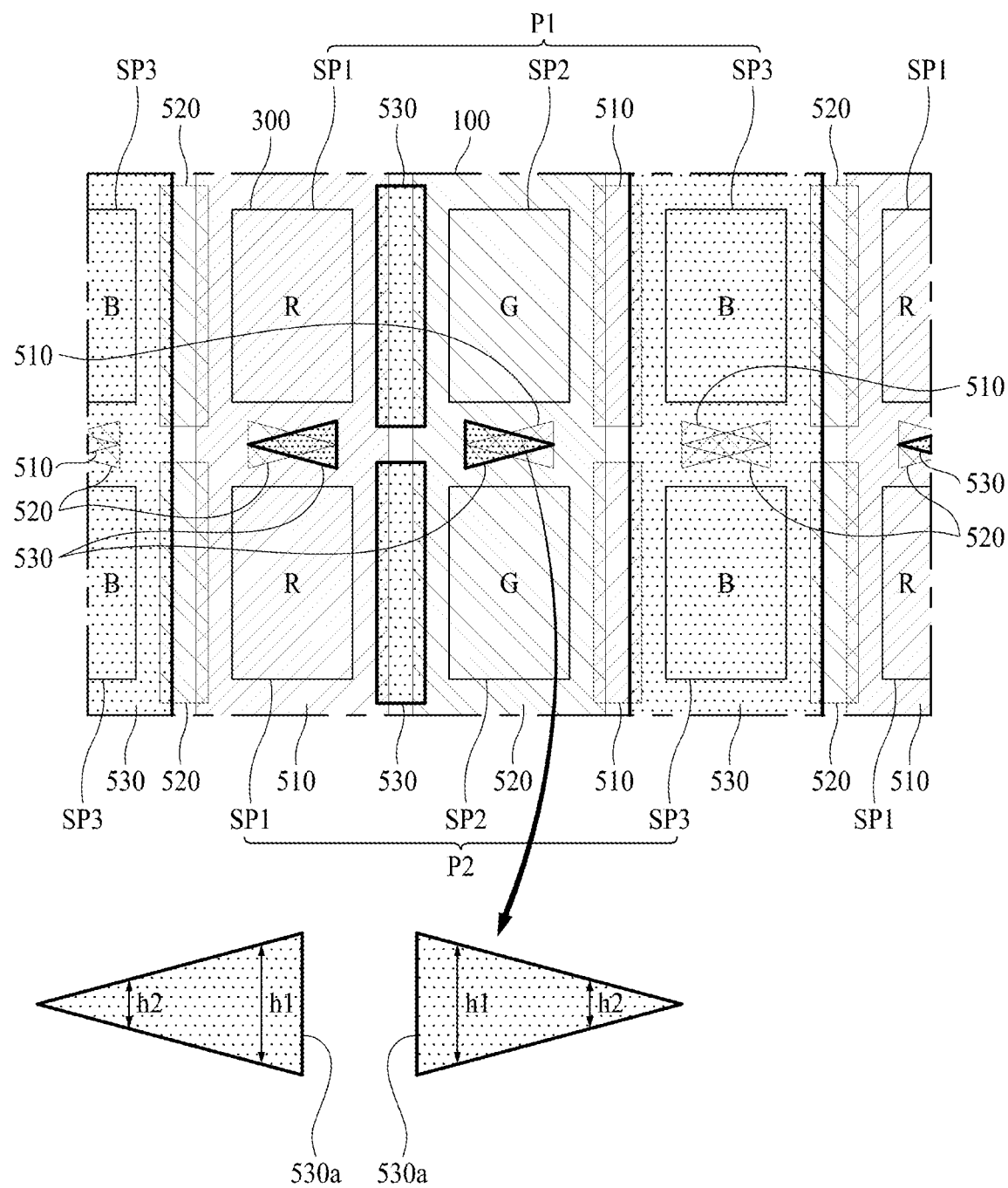

FIGS. 12A to 12C are process views illustrating a process of manufacturing the electroluminescent display apparatus of FIG. 11 and more easily show structures of the light emitting layers 510 to 530 through a process of forming the light emitting layers 510 to 530.

First, as seen in FIG. 12A, a first light emitting layer 510 may be continuously formed in a vertical direction in a first subpixel SP1 of a plurality of pixels (for example, first and second pixels) P1 and P2, a first light emitting layer 510 may be discontinuously formed in a boundary between a second subpixel SP2 and a third subpixel SP3 of the plurality of pixels P1 and P2, a first light emitting layer 510 may be formed in a boundary between a second subpixel SP2 of the first pixel P1 and a second subpixel SP2 of the second pixel P2, and a first light emitting layer 510 may be formed in a boundary between a third subpixel SP3 of the first pixel P1 and a third subpixel SP3 of the second pixel P2.

In this case, the first light emitting layer 510 discontinuously formed in the boundary between the second subpixel SP2 and the third subpixel SP3 of the plurality of pixels P1 and P2, the first light emitting layer 510 formed in the boundary between the second subpixel SP2 of the first pixel P1 and the second subpixel SP2 of the second pixel P2, and the first light emitting layer 510 formed in the boundary between the third subpixel SP3 of the first pixel P1 and the third subpixel SP3 of the second pixel P2 may be spaced apart from one another without contacting one another. Therefore, as described above with reference to FIG. 10, a shield layer 910 remaining in the second subpixel SP2 and a shield layer 910 remaining in the third subpixel SP3 may be connected to each other through a separation space between the first light emitting layers 510, and thus, may not easily be stripped before a liftoff process.

A vertical-direction width of the first light emitting layer 510 formed in the boundary between the second subpixel SP2 of the first pixel P1 and the second subpixel SP2 of the second pixel P2 may not be constant. In detail, a vertical-direction first width h1 of a portion of the first light emitting layer 510 relatively close to the boundary between the second subpixel SP2 and the third subpixel SP3 may be set to be greater than a vertical-direction second width h2 of a portion of the first light emitting layer 510 relatively farther away from the boundary between the second subpixel SP2 and the third subpixel SP3. Particularly, the first light emitting layer 510 formed in the boundary between the second subpixel SP2 of the first pixel P1 and the second subpixel SP2 of the second pixel P2 may be provided in a triangular structure, and one side 510a of the first light emitting layer 510 may face the boundary between the second subpixel SP2 and the third subpixel SP3 and may extend in a vertical direction.

Moreover, a vertical-direction width of the first light emitting layer 510 formed in the boundary between the third subpixel SP3 of the first pixel P1 and the third subpixel SP3 of the second pixel P2 may not be constant. In detail, a vertical-direction first width h1 of a portion of the first light emitting layer 510 relatively close to the boundary between the second subpixel SP2 and the third subpixel SP3 may be set to be greater than a vertical-direction second width h2 of a portion of the first light emitting layer 510 relatively farther away from the boundary between the second subpixel SP2 and the third subpixel SP3. Particularly, the first light emitting layer 510 formed in the boundary between the third subpixel SP3 of the first pixel P1 and the third subpixel SP3 of the second pixel P2 may be provided in a triangular structure, and one side 510a of the first light emitting layer 510 may face the boundary between the second subpixel SP2 and the third subpixel SP3 and may extend in a vertical direction.

Referring to FIGS. 6B to 6E described above, a region where the first light emitting layer 510 is provided may be a region from which each of the shield layer 910 and the photoresist layer 920 is removed, and in a liftoff process, a solvent may penetrate into, through the region, a lower surface of the shield layer 910 remaining in each of the second and third subpixels SP2 and SP3. In this case, in another aspect of the present disclosure, in order for the solvent to uniformly penetrate into the lower surface of the shield layer 910, the first width h1 of the first light emitting layer 510 may be set to be greater than the second width h2 of the first light emitting layer 510.

To provide a detailed description, since an area of the region from which each of the shield layer 910 and the photoresist layer 920 is removed is relatively wide in the first subpixel SP1 area, a large amount of solvent may penetrate from the first subpixel SP1 to the second and third subpixels SP2 and SP3, but since an area of the region from which each of the shield layer 910 and the photoresist layer 920 is removed is relatively narrow in the boundary between the second subpixel SP2 and the third subpixel SP3, a small amount of solvent may penetrate from the boundary between the second and third subpixels SP2 and SP3 to the second and third subpixels SP2 and SP3. Therefore, in another aspect of the present disclosure, in order to compensate for a penetration amount difference of the solvent, the first width h1 of a portion of the first light emitting layer 510 relatively close to the boundary between the second subpixel SP2 and the third subpixel SP3 may be set to be greater than the second width h2 of a portion of the first light emitting layer 510 relatively farther away from the boundary between the second subpixel SP2 and the third subpixel SP3, and thus, the amount of solvent penetrating from a portion close to the boundary between the second subpixel SP2 and the third subpixel SP3 may be set to be more than the amount of solvent penetrating from a portion farther away from the boundary between the second subpixel SP2 and the third subpixel SP3.

Subsequently, as seen in FIG. 12B, a second light emitting layer 520 may be continuously formed in a vertical direction in a second subpixel SP2 of the plurality of pixels P1 and P2, a second light emitting layer 520 may be discontinuously formed in a boundary between a third subpixel SP3 and a first subpixel SP1 of the plurality of pixels P1 and P2, a second light emitting layer 520 may be formed in a boundary between a third subpixel SP3 of the first pixel P1 and a third subpixel SP3 of the second pixel P2, and a second light emitting layer 520 may be formed in a boundary between a first subpixel SP1 of the first pixel P1 and a first subpixel SP1 of the second pixel P2.

In this case, the second light emitting layer 520 discontinuously formed in the boundary between the third subpixel SP3 and the first subpixel SP1 of the plurality of pixels P1 and P2, the second light emitting layer 520 formed in the boundary between the third subpixel SP3 of the first pixel P1 and the third subpixel SP3 of the second pixel P2, and the second light emitting layer 520 formed in the boundary between the first subpixel SP1 of the first pixel P1 and the first subpixel SP1 of the second pixel P2 may be spaced apart from one another without contacting one another. Therefore, as described above with reference to FIG. 10, a shield layer 910 remaining in the third subpixel SP3 and a shield layer 910 remaining in the first subpixel SP1 may be connected to each other through a separation space between the second light emitting layers 520, and thus, may not easily be stripped before a liftoff process.

A vertical-direction width of the second light emitting layer 520 formed in the boundary between the third subpixel SP3 of the first pixel P1 and the third subpixel SP3 of the second pixel P2 may not be constant. In detail, a vertical-direction first width h1 of a portion of the second light emitting layer 520 relatively close to the boundary between the third subpixel SP3 and the first subpixel SP1 may be set to be greater than a vertical-direction second width h2 of a portion of the second light emitting layer 520 relatively farther away from the boundary between the third subpixel SP3 and the first subpixel SP1. Particularly, the second light emitting layer 520 formed in the boundary between the third subpixel SP3 of the first pixel P1 and the third subpixel SP3 of the second pixel P2 may be provided in a triangular structure, and one side 520a of the second light emitting layer 520 may face the boundary between the third subpixel SP3 and the first subpixel SP1 and may extend in a vertical direction.

Moreover, a vertical-direction width of the second light emitting layer 520 formed in the boundary between the first subpixel SP1 of the first pixel P1 and the first subpixel SP1 of the second pixel P2 may not be constant. In detail, a vertical-direction first width h1 of a portion of the second light emitting layer 520 relatively close to the boundary between the third subpixel SP3 and the first subpixel SP1 may be set to be greater than a vertical-direction second width h2 of a portion of the second light emitting layer 520 relatively farther away from the boundary between the third subpixel SP3 and the first subpixel SP1. Particularly, the second light emitting layer 520 formed in the boundary between the first subpixel SP1 of the first pixel P1 and the first subpixel SP1 of the second pixel P2 may be provided in a triangular structure, and one side 520a of the second light emitting layer 520 may face the boundary between the third subpixel SP3 and the first subpixel SP1 and may extend in a vertical direction.

Subsequently, as seen in FIG. 12C, a third light emitting layer 530 may be continuously formed in a vertical direction in a third subpixel SP3 of the plurality of pixels P1 and P2, a third light emitting layer 530 may be discontinuously formed in a boundary between a first subpixel SP1 and a second subpixel SP2 of the plurality of pixels P1 and P2, a third light emitting layer 530 may be formed in a boundary between a first subpixel SP1 of the first pixel P1 and a first subpixel SP1 of the second pixel P2, and a third light emitting layer 530 may be formed in a boundary between a second subpixel SP2 of the first pixel P1 and a second subpixel SP2 of the second pixel P2.

In this case, the third light emitting layer 530 discontinuously formed in the boundary between the first subpixel SP1 and the second subpixel SP2 of the plurality of pixels P1 and P2, the third light emitting layer 530 formed in the boundary between the first subpixel SP1 of the first pixel P1 and the first subpixel SP1 of the second pixel P2, and the third light emitting layer 530 formed in the boundary between the second subpixel SP2 of the first pixel P1 and the second subpixel SP2 of the second pixel P2 may be spaced apart from one another without contacting one another. Therefore, as described above with reference to FIG. 10, a shield layer 910 remaining in the first subpixel SP1 and a shield layer 910 remaining in the second subpixel SP2 may be connected to each other through a separation space between the third light emitting layers 530, and thus, may not easily be stripped before a liftoff process.

A vertical-direction width of the third light emitting layer 530 formed in the boundary between the first subpixel SP1 of the first pixel P1 and the first subpixel SP1 of the second pixel P2 may not be constant. In detail, a vertical-direction first width h1 of a portion of the third light emitting layer 530 relatively close to the boundary between the first subpixel SP1 and the second subpixel SP2 may be set to be greater than a vertical-direction second width h2 of a portion of the third light emitting layer 530 relatively farther away from the boundary between the first subpixel SP1 and the second subpixel SP2. Particularly, the third light emitting layer 530 formed in the boundary between the first subpixel SP1 of the first pixel P1 and the first subpixel SP1 of the second pixel P2 may be provided in a triangular structure, and one side 530a of the third light emitting layer 530 may face the boundary between the first subpixel SP1 and the second subpixel SP2 and may extend in a vertical direction.

Moreover, a vertical-direction width of the third light emitting layer 530 formed in the boundary between the second subpixel SP2 of the first pixel P1 and the second subpixel SP2 of the second pixel P2 may not be constant. In detail, a vertical-direction first width h1 of a portion of the third light emitting layer 530 relatively close to the boundary between the first subpixel SP1 and the second subpixel SP2 may be set to be greater than a vertical-direction second width h2 of a portion of the third light emitting layer 530 relatively farther away from the boundary between the first subpixel SP1 and the second subpixel SP2. Particularly, the third light emitting layer 530 formed in the boundary between the second subpixel SP2 of the first pixel P1 and the second subpixel SP2 of the second pixel P2 may be provided in a triangular structure, and one side 530a of the third light emitting layer 530 may face the boundary between the first subpixel SP1 and the second subpixel SP2 and may extend in a vertical direction. That is, as a distance from a boundary between the first subpixel and the second subpixel gets further, a width of each of the third light emitting layer additionally provided between the first subpixel of the first pixel and the first subpixel of the second pixel and the third light emitting layer additionally provided between the second subpixel of the first pixel and the second subpixel of the second pixel is gradually decreased.

Figure 13:
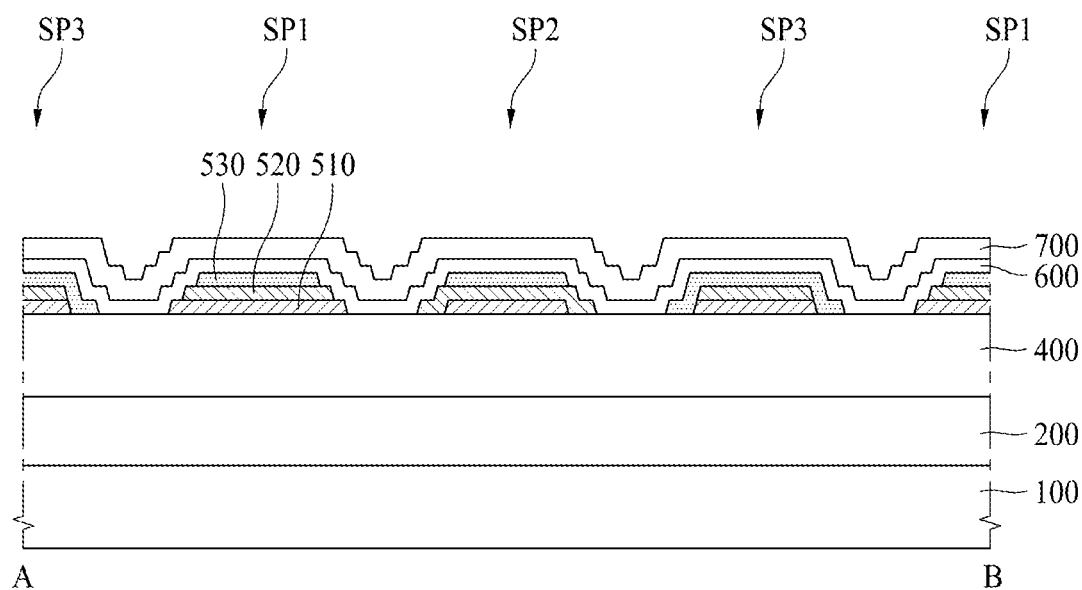
FIG. 13 is a cross-sectional view of an electroluminescent display apparatus according to another aspect of the present disclosure and is a cross-sectional view taken along line A-B of FIG. 11.

FIG. 13 is a cross-sectional view of an electroluminescent display apparatus according to another aspect of the present disclosure and is a cross-sectional view taken along line A-B of FIG. 11. That is, FIG. 13 is a cross-sectional view of a boundary region between a first pixel P1 and a second pixel P2, in which a first electrode 300 is not provided.

As seen in FIG. 13, a circuit device layer 200 may be provided on a substrate 100, and a bank 400 may be provided on the circuit device layer 200.

A plurality of light emitting layers 510 to 530 may be provided on the bank 400.

In detail, a first light emitting layer 510 having a relatively large width may be provided on the bank 400 in a region corresponding to a first subpixel SP1, and a second light emitting layer 520 and a third light emitting layer 530 each having a relatively small width may be sequentially provided on the first light emitting layer 510. In this case, widths of the second light emitting layer 520 and the third light emitting layer 530 may be the same, but are not limited thereto and may differ.

Moreover, a first light emitting layer 510 having a relatively small width may be provided on the bank 400 in a region corresponding to a second subpixel SP2, a second light emitting layer 520 having a relatively large width may be provided on the first light emitting layer 510, and a third light emitting layer 530 having a relatively small width may be provided on the second light emitting layer 520. In this case, widths of the first light emitting layer 510 and the third light emitting layer 530 may be the same, but are not limited thereto and may differ.

Moreover, a first light emitting layer 510 and a second light emitting layer 520 each having a relatively small width may be sequentially provided on the bank 400 in a region corresponding to a third subpixel SP3, and a third light emitting layer 530 having a relatively large width may be provided on the second light emitting layer 520. In this case, widths of the first light emitting layer 510 and the second light emitting layer 520 may be the same, but are not limited thereto and may differ.

Figure 14A:
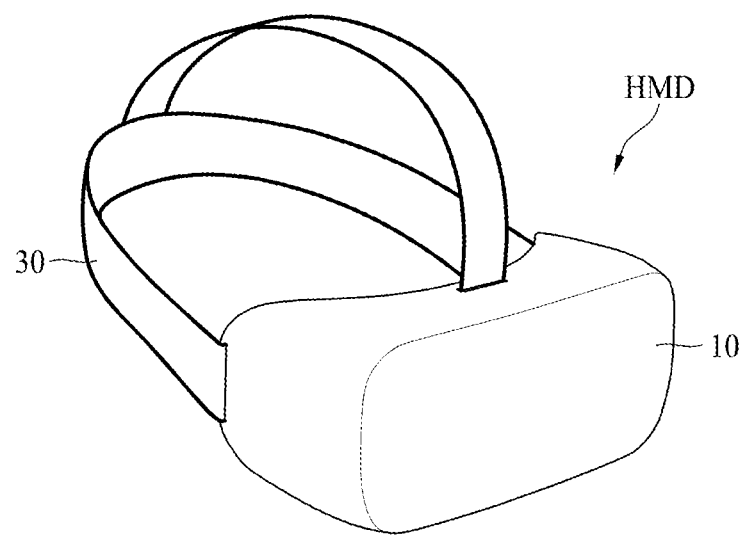
FIGS. 14A to 14C relate to an electroluminescent display apparatus according to another aspect of the present disclosure and relate to a head-mounted display (HMD) apparatus.
Figure 14B:
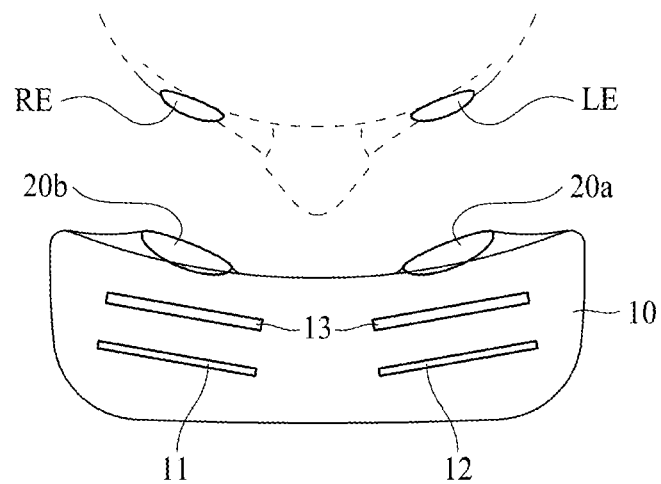
Figure 14C:
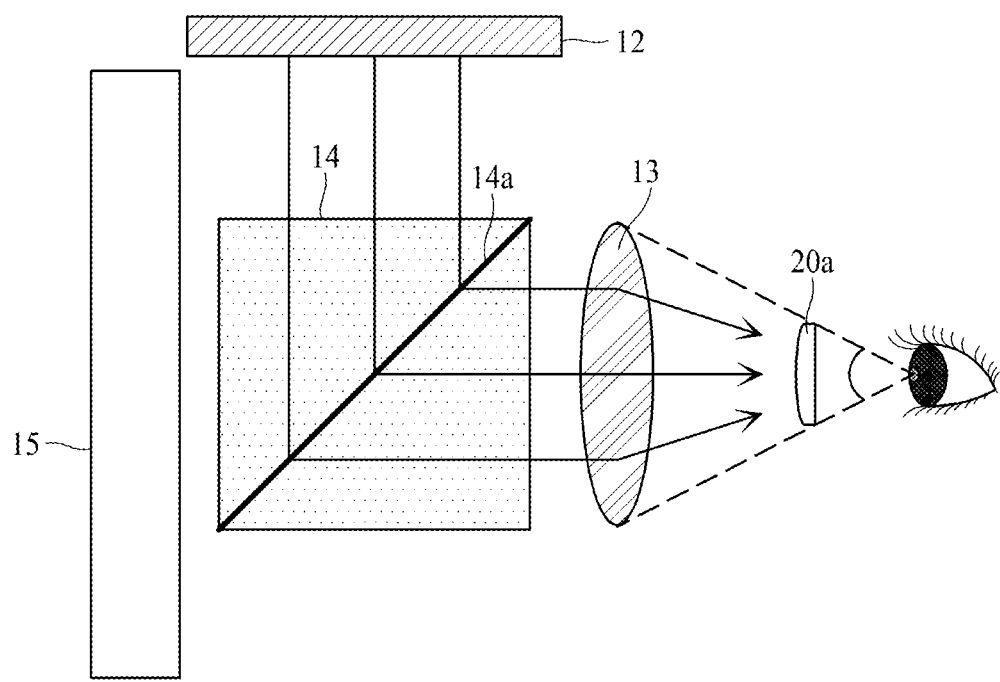

FIGS. 14A to 14C relate to an electroluminescent display apparatus according to another aspect of the present disclosure and relate to a head-mounted display (HMD) apparatus. FIG. 14A is a schematic perspective view, FIG. 14B is a schematic plan view of a virtual reality (VR) structure, and FIG. 14C is a schematic cross-sectional view of an augmented reality (AR) structure.

As seen in FIG. 14A, the HMD apparatus according to the present disclosure may include an accommodating case 10 and a head-mounted band 30.

The accommodating case 10 may accommodate elements such as a display apparatus, a lens array, and an eyepiece lens.

The head-mounted band 30 may be fixed to the accommodating case 10. The head-mounted band 30 is illustrated as being provided to surround an upper surface of both side surfaces of a user, but is not limited thereto. The head-mounted band 30 may fix the HMD apparatus to a head of a user and may be replaced by a glasses frame type structure or a helmet type structure.

As seen in FIG. 14B, an HMD apparatus having the VR structure according to the present disclosure may include a left-eye display apparatus 12, a right-eye display apparatus 11, a lens array 13, a left-eye eyepiece lens 20a, and a right-eye eyepiece lens 20b.

The left-eye display apparatus 12, the right-eye display apparatus 11, the lens array 13, the left-eye eyepiece lens 20a, and the right-eye eyepiece lens 20b may be accommodated into the accommodating case 10.

The left-eye display apparatus 12 and the right-eye display apparatus 11 may display the same image, and in this case, a user may watch a two-dimensional (2D) image. Alternatively, the left-eye display apparatus 12 may display a left-eye image, and the right-eye display apparatus 11 may display a right-eye image. Each of the left-eye display apparatus 12 and the right-eye display apparatus 11 may be configured as the electroluminescent display apparatus of each of FIGS. 1 to 13. In this case, in FIGS. 1 to 13, a surface (for example, an encapsulation layer 700) displaying an image may face the lens array 13.

The lens array 13 may be spaced apart from each of the left-eye eyepiece lens 20a and the left-eye display apparatus 12 and may be provided between the left-eye eyepiece lens 20a and the left-eye display apparatus 12. That is, the lens array 13 may be disposed in front of the left-eye eyepiece lens 20a and behind the left-eye display apparatus 12. Also, the lens array 13 may be spaced apart from each of the right-eye eyepiece lens 20b and the right-eye display apparatus 11 and may be provided between the right-eye eyepiece lens 20b and the right-eye display apparatus 11. That is, the lens array 13 may be disposed in front of the right-eye eyepiece lens 20b and behind the right-eye display apparatus 11.

The lens array 13 may be a micro-lens array. The lens array 13 may be replaced by a pin hole array. By using the lens array 13, an image displayed by the left-eye display apparatus 12 or the right-eye display apparatus 11 may be zoomed in by a certain magnification, and thus, a zoomed-in image may be seen by a user.

A left eye LE of a user may be located at the left-eye eyepiece lens 20a, and a right eye RE of the user may be located at the right-eye eyepiece lens 20b.

As seen in FIG. 14C, an HMD apparatus having the AR structure according to the present disclosure may include a left-eye display apparatus 12, a lens array 13, a left-eye eyepiece lens 20a, a transmissive reflection part 14, and a transmissive window 15. In FIG. 14C, for convenience, only left-eye elements are illustrated, and right-eye elements may be the same as the left-eye elements.

The left-eye display apparatus 12, the lens array 13, the left-eye eyepiece lens 20a, the transmissive reflection part 14, and the transmissive window 15 may be accommodated into the accommodating case 10.

The left-eye display apparatus 12 may be disposed in one side (for example, an upper side) of the transmissive reflection part 14 without covering the transmissive window 15. Therefore, the left-eye display apparatus 12 may provide an image to the transmissive reflection part 14 without covering an external background seen through the transmissive window 15.

The left-eye display apparatus 12 may be configured as the electroluminescent display apparatus of each of FIGS. 1 to 13. In this case, in FIGS. 1 to 13, a surface (for example, an encapsulation layer 700) displaying an image may face the lens array 13.

The lens array 13 may be provided between the left-eye eyepiece lens 20a and the transmissive reflection part 14.

The left eye of the user may be located at the left-eye eyepiece lens 20a.

The transmissive reflection part 14 may be disposed between the lens array 13 and the transmissive window 15. The transmissive reflection part 14 may include a reflection surface 14a which transmits a portion of light and reflects the other portion of the light. The reflection surface 14a may be provided so that an image displayed by the left-eye display apparatus 12 travels to the lens array 13. Accordingly, the user may see, through the transmissive window 15, all of the external background and the image displayed by the left-eye display apparatus 12. That is, the user may see one image which includes a real background and a virtual image, and thus, AR may be implemented.

The transmissive window 15 may be disposed in front of the transmissive reflection part 14.

According to the aspects of the present disclosure, the light emitting layers emitting different lights may be respectively patterned in subpixels by using the shield layer and the photoresist layer, and thus, the light emitting layers may be precisely patterned in the subpixels which are densely arranged.

Particularly, according to the aspects of the present disclosure, the first light emitting layer may be further provided between the second subpixel and the third subpixel, the second light emitting layer may be further provided between the third subpixel and the first subpixel, and the third light emitting layer may be further provided between the first subpixel and the second subpixel. Accordingly, a solvent penetration space may increase in a liftoff process of manufacturing the electroluminescent display apparatus, and thus, the first to third light emitting layers may be more precisely patterned.

The above-described feature, structure, and effect of the present disclosure are included in at least one aspect of the present disclosure, but are not limited to only one aspect. Furthermore, the feature, structure, and effect described in at least one aspect of the present disclosure may be implemented through combination or modification of other aspects by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An electroluminescent display apparatus comprising:
a first subpixel, a second subpixel, and a third subpixel defined on a substrate;
a first electrode disposed in each of the first subpixel, the second subpixel, and the third subpixel in the substrate;
a bank provided between two adjacent subpixels among the first subpixel, the second subpixel, and the third subpixel to cover an edge of the first electrode and define an emission area;
a first light emitting layer disposed on the first electrode of the first subpixel;
a second light emitting layer disposed on the first electrode of the second subpixel;
a third light emitting layer disposed on the first electrode of the third subpixel; and
a second electrode disposed on the first to third light emitting layers,
wherein the third light emitting layer is extended onto the bank between the first subpixel and the second subpixel, and
wherein the extended third light emitting layer does not overlap with the first light emitting layer in the emission area.

2. The electroluminescent display apparatus of claim 1, wherein the extended third light emitting layer is disposed on an upper surface of each of the first light emitting layer and the second light emitting layer on the bank.

3. The electroluminescent display apparatus of claim 1, wherein the first light emitting layer is further disposed on the bank between the second subpixel and the third subpixel and overlaps the second light emitting layer and the third light emitting layer.

4. The electroluminescent display apparatus of claim 3, wherein the first light emitting layer disposed on the bank between the second subpixel and the third subpixel is located under a lower surface of each of the second light emitting layer and the third light emitting layer.

5. The electroluminescent display apparatus of claim 1, wherein the second light emitting layer is further disposed on the bank between the third subpixel and the first subpixel and overlaps the third light emitting layer and the first light emitting layer.

6. The electroluminescent display apparatus of claim 5, wherein the second light emitting layer disposed on the bank between the third subpixel and the first subpixel is located on an upper surface of the first light emitting layer and under a lower surface of the third light emitting layer.

7. The electroluminescent display apparatus of claim 1, further comprising a fourth light emitting layer provided on the first light emitting layer, the second light emitting layer and the third light emitting layer,
wherein the fourth light emitting layer is extended to boundary regions between two adjacent subpixels among the first to third subpixels.

8. The electroluminescent display apparatus of claim 7, wherein the first light emitting layer comprises a hole injecting layer, a hole transporting layer and an organic light emitting layer emitting light of a first color,
the second light emitting layer comprises a hole injecting layer, a hole transporting layer and an organic light emitting layer emitting light of a second color,
the third light emitting layer comprises a hole injecting layer, a hole transporting layer and an organic light emitting layer emitting light of a third color, and
the fourth light emitting layer comprises at least one of an electron transporting layer and an electron injecting layer.

9. The electroluminescent display apparatus of claim 1, wherein the second electrode has a same pattern as each of the first light emitting layer provided in the first subpixel, the second light emitting layer provided in the second subpixel, and the third light emitting layer provided in the third subpixel, and
wherein the extended third light emitting layer is disposed on an upper surface of the second electrode provided on the first light emitting layer and an upper surface of the second electrode provided on the second light emitting layer.

10. The electroluminescent display apparatus of claim 9, wherein the second electrode is disposed on the extended third light emitting layer and has a same pattern as the extended third light emitting layer.

11. The electroluminescent display apparatus of claim 1, further comprising:
a lens array spaced apart from the substrate; and
an accommodating case accommodating the substrate and the lens array.

12. An electroluminescent display apparatus comprising:
a first pixel and a second pixel each including a first subpixel emitting light of a first color, a second subpixel emitting light of a second color, and a third subpixel emitting light of a third color, the first pixel and the second pixel provided in a substrate;

a first electrode in each of the first subpixel, the second subpixel, and the third subpixel in the substrate;

a bank provided between the first pixel and the second pixel and between two adjacent subpixels among the first to third subpixels to cover an edge of the first electrode and define an emission area;

a first light emitting layer disposed on the first electrode of the first subpixel;

a second light emitting layer disposed on the first electrode of the second subpixel;

a third light emitting layer disposed on the first electrode of the third subpixel; and a second electrode disposed on the first to third light emitting layers, wherein the third light emitting layer is extended onto the bank between the first subpixel and the second subpixel and overlaps the first light emitting layer and the second light emitting layer on the bank, and wherein the extended third light emitting layer does not overlap with the first light emitting layer in the emission area.

13. The electroluminescent display apparatus of claim 12, wherein the first light emitting layer is extended onto the bank between the second subpixel and the third subpixel and overlaps the second light emitting layer and the third light emitting layer, and wherein the second light emitting layer is extended onto the bank between the third subpixel and the first subpixel and overlaps the third light emitting layer and the first light emitting layer.

14. The electroluminescent display apparatus of claim 12, wherein the extended third light emitting layer is disconnected in a boundary region between the first pixel and the second pixel.

15. The electroluminescent display apparatus of claim 12, wherein the second light emitting layer and the third light emitting layer are disposed between the first subpixel of the first pixel and the first subpixel of the second pixel, wherein the first light emitting layer and the third light emitting layer are disposed between the second subpixel of the first pixel and the second subpixel of the second pixel, and wherein the first light emitting layer and the second light emitting layer are disposed between the third subpixel of the first pixel and the third subpixel of the second pixel.

16. The electroluminescent display apparatus of claim 15, wherein the third light emitting layer disposed between the first subpixel of the first pixel and the first subpixel of the second pixel are spaced apart from the third light emitting layer disposed between the second subpixel of the first pixel and the second subpixel of the second pixel.

17. The electroluminescent display apparatus of claim 15, wherein the third light emitting layer disposed between the first subpixel of the first pixel and the first subpixel of the second pixel comprises a first portion having a first width and a second portion having a second width smaller than the first width, and wherein the first portion is closer to a boundary between the first subpixel and the second subpixel than the second portion.

18. The electroluminescent display apparatus of claim 15, wherein, in a region between the first subpixel of the first pixel and the first subpixel of the second pixel, the second light emitting layer and the third light emitting layer are sequentially stacked on the first light emitting layer to each have a narrower width than that of the first light emitting layer in the region.

19. The electroluminescent display apparatus of claim 12, further comprising a fourth light emitting layer provided on the first, second and third light emitting layers and in an entire boundary region between two adjacent subpixels among the first to third subpixels, wherein each of the first to third light emitting layers comprises a hole injecting layer, a hole transporting layer and an organic light emitting layer, and wherein the fourth light emitting layer comprises at least one of an electron transporting layer and an electron injecting layer.

20. The electroluminescent display apparatus of claim 12, wherein the second electrode has a same pattern as each of the first light emitting layer provided in the first subpixel, the second light emitting layer provided in the second subpixel and the third light emitting layer provided in the third subpixel, and wherein the third light emitting layer is disposed on an upper surface of the second electrode provided on the first light emitting layer and an upper surface of the second electrode provided on the second light emitting layer.

* * * * *